United States Patent
Avishai et al.

(10) Patent No.: US 12,288,705 B2
(45) Date of Patent: Apr. 29, 2025

(54) FIB-SEM 3D TOMOGRAPHY FOR MEASURING SHAPE DEVIATIONS OF HAR STRUCTURES

(71) Applicant: Carl Zeiss SMT GmbH, Oberkochen (DE)

(72) Inventors: Amir Avishai, Pleasanton, CA (US); Alex Buxbaum, San Ramon, CA (US); Eugen Foca, Ellwangen (DE); Dmitry Klochkov, Schwaebisch Gmuend (DE); Thomas Korb, Schwaebisch Gmuend (DE); Keumsil Lee, Palo Alto, CA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 419 days.

(21) Appl. No.: 17/707,151

(22) Filed: Mar. 29, 2022

(65) Prior Publication Data
US 2022/0223445 A1    Jul. 14, 2022

Related U.S. Application Data

(63) Continuation of application No. PCT/EP2020/076332, filed on Sep. 21, 2020.
(Continued)

(51) Int. Cl.
   *H01L 21/67*      (2006.01)
   *G06T 7/00*       (2017.01)
   *H01J 37/22*      (2006.01)

(52) U.S. Cl.
   CPC ...... *H01L 21/67288* (2013.01); *G06T 7/0004* (2013.01); *G06T 7/0006* (2013.01);
(Continued)

(58) Field of Classification Search
   CPC ............ H01L 21/67288; G06T 7/0006; G06T 2207/10061; G06T 2207/10072;
(Continued)

(56) References Cited

U.S. PATENT DOCUMENTS

| 5,953,388 A | 9/1999 | Walnut et al. |
| 9,741,536 B2 * | 8/2017 | Lee ............ H01J 37/3056 |

(Continued)

FOREIGN PATENT DOCUMENTS

| CN | 109064476 A | 12/2018 |
| CN | 109690749 A | 4/2019 |

(Continued)

OTHER PUBLICATIONS

International Preliminary Report on Patentability for corresponding PCT Appl No. PCT/EP2020/076332, dated May 12, 2022.
(Continued)

*Primary Examiner* — Michael P LaPage
(74) *Attorney, Agent, or Firm* — Fish & Richardson P.C.

(57) ABSTRACT

A 3D tomographic inspection method for the inspection of semiconductor features in an inspection volume of a semiconductor wafer includes obtaining a 3D tomographic image, and selecting a plurality of 2D cross section images. The method also includes identifying contours of HAR structures, and extracting deviation parameters. The deviation parameters describe fabrication errors such as displacement, deviation in radius or diameter, area or shape.

19 Claims, 27 Drawing Sheets

Related U.S. Application Data

(60) Provisional application No. 62/928,562, filed on Oct. 31, 2019.

(52) U.S. Cl.
CPC .. *H01J 37/222* (2013.01); *G06T 2207/10061* (2013.01); *G06T 2207/10072* (2013.01); *G06T 2207/30148* (2013.01); *G06T 2207/30172* (2013.01); *H01J 2237/2817* (2013.01)

(58) Field of Classification Search
CPC . G06T 2207/30148; G06T 2207/30172; G06T 7/0004; G06T 7/13; H01J 37/222; H01J 2237/2817; H01J 2237/221; H01J 37/28; G01B 11/08; G01B 11/24
See application file for complete search history.

(56) References Cited

U.S. PATENT DOCUMENTS

| | | | |
|---|---|---|---|
| 2005/0104017 A1 | 5/2005 | Kimba et al. | |
| 2005/0116182 A1 | 6/2005 | Tanaka et al. | |
| 2008/0174779 A1 | 7/2008 | Kaga et al. | |
| 2009/0296073 A1* | 12/2009 | Wagganer | G01N 23/2202 356/72 |
| 2013/0213945 A1* | 8/2013 | Stegmann | G01N 23/04 219/121.83 |
| 2019/0139735 A1 | 5/2019 | Alvis et al. | |
| 2020/0173772 A1* | 6/2020 | Subrahmanyan | H01J 37/28 |
| 2020/0373120 A1* | 11/2020 | Yuli | H01J 37/222 |

FOREIGN PATENT DOCUMENTS

| | | | |
|---|---|---|---|
| CN | 109791897 A | 5/2019 | |
| CN | 109801271 A | 5/2019 | |
| CN | 109964116 A | 7/2019 | |
| JP | H06190569 A | 7/1994 | |
| JP | H09-259810 A | 10/1997 | |
| TW | 201439501 A | 10/2014 | |
| TW | 201619690 A | 6/2016 | |
| WO | WO9702465 A1 | 1/1997 | |
| WO | WO-2014055876 A1 * | 4/2014 | C23C 14/46 |

OTHER PUBLICATIONS

Li Huanliang, "Image Contour Extraction Method based on Computer Technology," 4th National Conference on Electrical, Electronics and Computer Engineering (NCEECE 2015), 1185-1189 (2016).

International Search Report and Written Opinion for corresponding PCT Appl No. PCT/EP2020/076332, dated Jan. 13, 2021.

Taiwanese Office Action and Search Report, with English Translation thereof, for corresponding TW Patent Appl. No. 109137853, dated Aug. 30, 2021.

Chinese Office Action and Search Report, with English Translation thereof, for corresponding CN Patent Appl. No. 202080075565.X, dated Feb. 23, 2024.

* cited by examiner

FIG. 4B
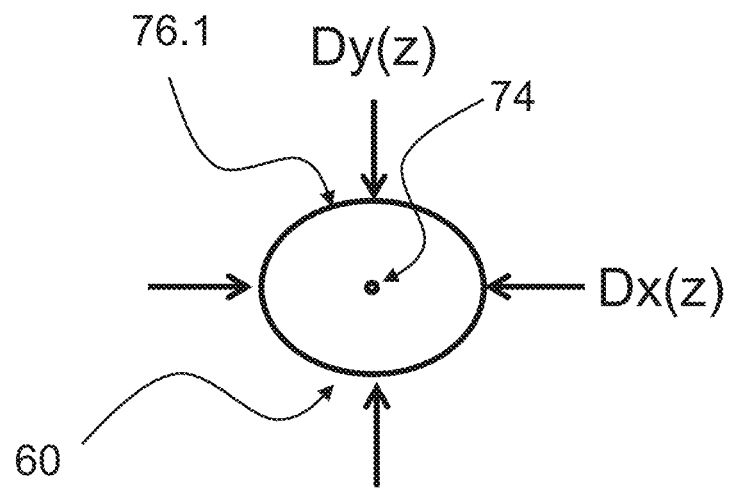
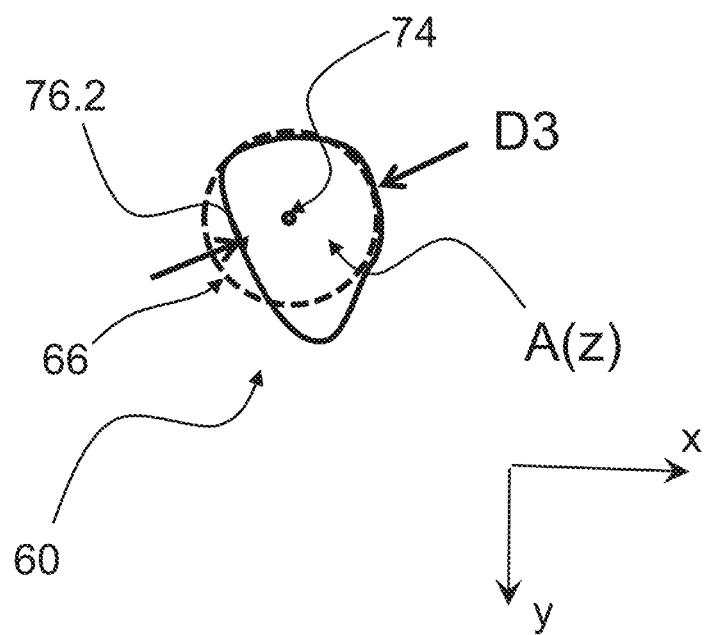

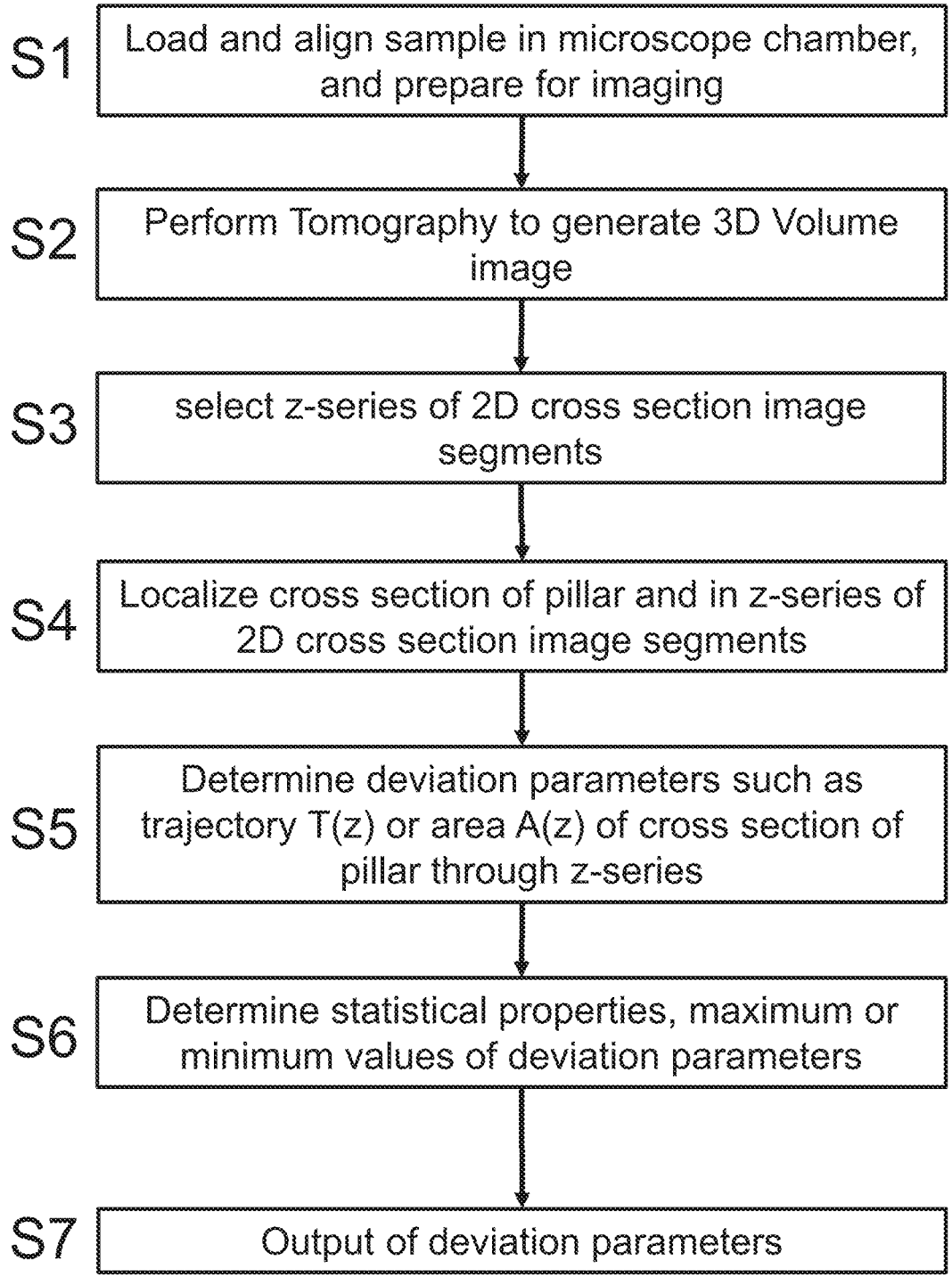

FIB-SEM 3D TOMOGRAPHY FOR MEASURING SHAPE DEVIATIONS OF HAR STRUCTURES

CROSS-REFERENCE TO RELATED APPLICATIONS

The present application is a continuation of, and claims benefit under 35 USC 120 to, international application PCT/EP2020/076332, filed Sep. 21, 2020, which claims benefit under 35 USC 119 of German Application No. 10 2018 201 170.2, filed Jan. 25, 2019. The entire disclosure of these applications are incorporated by reference herein.

FIELD

The present disclosure relates to a three-dimensional circuit pattern inspection and measurement technique by cross sectioning of integrated circuits. As an example, the present disclosure relates to a method of obtaining a 3D volume image of a channel or HAR structure within an integrated semiconductor sample and to a corresponding computer program product and a corresponding semiconductor inspection device. The method, computer program product and device can be utilized for quantitative metrology, defect detection, defect review, and inspection of shape or cross section, inclination or trajectory of a channel or HAR structure within an integrated semiconductor sample by using a scanning charged particle microscope.

BACKGROUND

Semiconductor structures are amongst the finest man-made structures and suffer from very few imperfections only. These rare imperfections are the signatures which defect detection or defect review or quantitative metrology devices are looking for.

Fabricated semiconductor structures are based on prior knowledge. For example, in a logic type sample, metal lines run parallel in metal layers or HAR (high aspect ratio) structures or metal vias run perpendicular to the metal layers. The angle between metal lines in different layers is either 0° or 90°. On the other hand, for VNAND type structures it is known that their cross sections are spherical on average.

Integrated Semiconductors are fabricated by processing a series of layers on a Silicon Substrate by planar integration techniques. Each layer is first planarized and then structured by a pattern within a lithography process by a projection exposure apparatus. The lithography pattern is transferred into the silicon layer by several techniques, including etching, deposition, doping or implantation. A cross section perpendicular to a set of layers is shown in FIGS. 1A and 1B. The integrated semiconductor 50 includes a set of layers 54.1, 54.2, . . . 54.22, which are fabricated by planar integration techniques parallel to the top surface 52, which extends in x-y-direction. Beyond the lowest layer 54.22 is the bulk Silicon substrate 51 of the semiconductor substrate or wafer, which is not shown in its entire depth. The lowest layer 54.22 is a layer in which doped structures 58 in the Silicon substrate are formed by e.g. implantation. On top of this layer, a series of so-called metal layers structured with metal conductors, such as metal layers 54.1, 54.3, . . . 54.17 . . . alternates with a series of isolation layers, such as isolation layers 54.2, 54.4, . . . . The isolation layers include interconnects to contact two neighboring metal layers, such as vias 55 between a metal structure 56 in metal layer 54.1 and the metal structure in metal layer 54.3. The lowest metal layer includes a series of gates 57 with contacts 59 in the adjacent isolation layer.

With increasing depth in z-direction, the minimum feature sizes in the layers become smaller. The current minimum feature size or critical dimension in the lowest, most critical layers is generally below 10 nm, for example 7 nm or 5 nm, and likely approaching below 3 nm in near future. With the small extension of the minimum feature sizes, the lateral placement of the layers in x- and y-direction becomes more and more demanding. The lateral overlay accuracy of two layers typically is in the order of ⅓ of the minimum feature size in the two layers. Thus, the lateral alignment of the lowest layers is on the order of few nm, and in near future even below 1 nm.

FIG. 2 shows another example of a cross section through a semiconductor device, such as a NAND memory device. In this example, several pillars, such as the three pillars indicated by reference number 60, extend through a large set of metal and isolation layers 54.1, . . . 54.$k$, . . . 54.$z$, and establish conducting connections perpendicular to the layers. The pillars 60 are also called HAR (high aspect ratio)—structures, or sometimes contact channels. While metal structures within the metal layers, parallel to the surface 52 are fabricated at once with the high precision of planar fabrication techniques, the pillars 60 are formed by a large series or small metal structures in each subsequent layer, stacked on top of each other. The pillars thus can suffer from several damages, thus as errors in the processing of individual planar layers as well as overlay errors between subsequent planar layers. Errors or defects within the pillars, however, limit the performance of a semiconductor device or may cause failure of such a device.

Known techniques employed to analyze integrated semiconductor devices generally utilize a 2D imaging approach. For example, a thin slice or lamella is formed from the semiconductor device, e.g. by ion beam milling, and the thin sample is extracted by a probe. The lamella can either be a so-called "planar view" or a "cross view"—sample, being either parallel or perpendicular integrated semiconductor device. The lamella is further analyzed by e.g. a scanning electron microscope (SEM or STEM) or by a transmission electron microscope (TEM). This method involves removing material from both in front and behind the channels or pillars, which can result in imprecise measurements. Portions of the pillar, hole or channel may have been removed from the thin slice and are missing from the imaging lamella.

Another method is the 2D image generation of individual intersection planes either parallel or perpendicular to the integrated semiconductor device, generated by milling and imaging with a Cross Beam or dual beam device. However, HAR Pillars or holes or channels, as described above, are manufactured with shapes that are not always predictable or known. They can take twist and bend and extend outside a planar 2D intersection. 2D techniques can fail to capture the true path or trajectory of these structures, as well as the shape properties of these structures, because the HAR Pillars or holes or channels may not be limited to a planar intersection plane. Next, a cross section surface for 2D imaging can be deteriorated by an effect called curtaining, such that a cross section surface can show some waviness and the 2D image may contain only parts of semiconductor structures. 2D imaging methods generally only capture the portion of their shape, where they intersect the imaging surface or thin slice volume.

Recently, 3D volume image generation has been introduced. 3D volume images are generated via a cross sectioning technique, utilizing a charged particle beam system to slice and image an integrated semiconductor to determine a 3D volume image of a predetermined volume within the integrated semiconductor. Such a cross section imaging technique includes the generation and storing of a large set of 2D cross section images, and the registration of the 2D cross sections images within a volume to generate a 3D volume image of high precision. The charged particle system can include an electron microscope (SEM) for imaging and a focused ion beam system (FIB) for slicing, or an ion beam system for slicing and imaging.

SUMMARY

It remains a challenge to determine errors or defects of pillars or holes or deviations of the structure, including the internal structure of pillars. It also remains a challenge determine errors or defects of pillars, pillars or holes from 3D volume images with high accuracy.

The present disclosure seeks to provide an improved method of obtaining a 3D volume image of a pillar or HAR structure. As an example, the method allows for an accurate 3D reconstruction of a pillar or HAR structure by a series of cross section images.

The present disclosure provides a method for high precision, 3D reconstruction of 3D volume images or 3D shapes of HAR structures by cross sectioning of the integrated circuits and, for example, a method, computer program product and apparatus for obtaining 3D volume images of an HAR structure.

The method can allow for quantitative metrology of diameters and shapes of cross sections of HAR structures, as well as the determination of trajectories of HAR structures within the integrated circuits. Furthermore, the disclosure provides a method, computer program product and apparatus for a determination of a channel trajectory through an integrated semiconductor device, and the determination of the deviation of the channel trajectory from an ideal channel trajectory with high precision in the order of below few nm.

In an embodiment of the disclosure, the 3D shape of such pillars within an integrated semiconductor sample is measured via a cross sectioning technique, utilizing a charged particle beam system to slice and image an integrated semiconductor to determine a 3D volume image of a predetermined volume within the integrated semiconductor. Such a cross section imaging technique includes the generation and storing of a set of cross section images. The charged particle system can include an electron microscope (SEM) for imaging and a focused ion beam system (FIB) for slicing, or an ion beam system for slicing and imaging.

3D memory chips (VNAND or 3D RAM) are generally composed of many pillar-like structures running parallel to each other and sometimes referred to as memory channels or "pillars". According an embodiment or the disclosure, a sample containing such a 3D memory device can be studied by the cross-section imaging technique utilizing a FIB-SEM-microscope. The FIB (Focused Ion Beam) is used to remove a thin layer of material from the probe slice by slice. In an example, the FIB is arranged such that the slices are oriented perpendicular to the pillar/channel axes, each new exposed surface will contain footprints of the pillars which usually have a circular shape and form a hexagonal grid. Each new exposed surface or slice is imaged by SEM (scanning electron microscope) or another charged particle imaging microscope one by one as the removal of the material from the probe with FIB is progressing. The 3D shape of the pillars is reconstructed using the stack of 2D slice images. The typical number of footprints of pillars in one slice can reach a few hundred. The typical stack of image slices can contain a few hundred images. In most applications, a large degree of automatization while reconstructing the pillars in 3D is desirable. In an embodiment, an automated workflow for such a reconstruction is described.

In an embodiment of the disclosure, a cross section image of at least one HAR structure is determined and extracted by image processing and/or pattern recognition within an intersection plane of the 3D volume image of the integrated circuit. The exact position of the cross-section image of the at least one HAR structure is thereby determined within the predetermined volume with high accuracy. By repeating the determination and extraction of subsequent cross section images of the at least one HAR structure in subsequent intersection planes of the 3D volume image of the integrated circuit, the isolated 3D volume image of the HAR structure within the predetermined volume within the integrated semiconductor can be generated.

In an embodiment of the disclosure, the cross-section image of the at least one HAR structure is automatically evaluated by image processing to extract shape properties such as a lateral dimension of the cross section. In an example, an ellipse is approximated to the cross section of the at least one HAR structure. In another example, the shape properties include the area of the cross-section images. In an example, the shape properties of an HAR structure are utilized for defect detection or defect review.

In an embodiment, the evaluation further includes the extraction of the center of the cross-section image of the at least one HAR structure within the 3D volume image with high accuracy. The extraction of the center can be accomplished by computation of the center of gravity of the cross-section image of the at least one HAR structure.

By repeating the evaluation of subsequent cross section images of the at least one HAR structure in subsequent intersection planes of the 3D volume image of the integrated circuit, the 3D channel trajectory or 3D trajectory can be generated. In one example, the 3D placement deviation trajectory is derived from the deviation of the 3D trajectory from an ideal or design trajectory. Since the coordinate system can be arranged such that the design trajectory extends in z-direction, perpendicular to the top surface of the integrated semiconductor, the 3D placement deviation trajectory is either evaluated along the 3D trajectory of the channel or in z-direction. From the 3D placement deviation trajectory, a maximum placement deviation can be derived. In one example, the maximum slop angle of the 3D trajectory relative the z-direction is derived. In one example, a wiggling or twisted shape of the 3D trajectory relative the z-direction is derived In an embodiment, the shape properties along the 3D trajectory of the HAR structure within the predetermined volume within the integrated semiconductor are generated repeatedly in a similar manner. Since the coordinate system can be arranged such that the design trajectory extends in z-direction, perpendicular to the top surface of the integrated semiconductor, the shape properties are either evaluated along the 3D trajectory of the channel or in z-direction.

In an embodiment, the conductivity of the channel is determined by the minimum cross section area of in the channel. In another embodiment, peaks, defects or disruptions or inclusions within the channel boundary surface are extracted.

In an embodiment, the 3D trajectories and shape properties of an HAR structure are determined and evaluated at least for two HAR structures. In addition to the 3D trajectories and shape properties of individual HAR structures, also relative properties of the at least two HAR structures can be evaluated. The relative properties can include the channel proximity, such as distance of the 3D trajectories as well as the minimum distance of the outer boundary of the at least two HAR channels.

In an embodiment, a method of the disclosure includes analyzing a set of HAR structures within an integrated semiconductor device, including obtaining a 3D tomographic image of a semiconductor sample, selecting a subset of 2D cross section image segments from the 3D tomographic image, each including cross section images of a set of HAR structures, identification of a contour of each HAR structures within the set of HAR structures in the subset of 2D cross section images, extraction of deviation parameters from the contours of the HAR structures of the set of HAR structures, analyzing the deviation parameters, wherein the derivation parameters include one or more of a displacement from an ideal position, a deviation in radius or diameter, a deviation from a cross section area, a deviation from a shape of a cross section.

In an embodiment, the method further includes performing statistical analysis of at least one deviation parameter of at least one HAR structure of the set of HAR structures. In an example, the deviation parameter of the displacement from an ideal position includes a tilt or a wiggling of an HAR structure.

In an embodiment, the method further includes a step of obtaining 3D tomographic image includes obtaining the 3D tomographic image by a charged particle microscope having at least one charged particle optical column.

In an embodiment, the method further utilizes includes a charged particle microscope including a focused ion beam system (FIB) and a scanning electron microscope (SEM) arranged relative to each other at an angle between 45° and 90°. In an example, the relative angle is 90°, such that the FIB is oriented parallel to a surface of a semiconductor sample and the SEM is oriented perpendicular to the surface of the semiconductor sample.

In an embodiment, the method further includes image processing, edge detection or pattern recognition in the step of identification of at least a contour of each HAR structures.

In an embodiment, the method further includes a computation of minimum or maximum values of at least one deviation parameter of at least one HAR structure of the set of HAR structures.

In an embodiment, the method further includes computing at least a distance between two adjacent HAR structures and a minimum distance between the two adjacent HAR structures.

In an embodiment, the method further includes a detection and a localization of at least one local defect or inclusion in at least one HAR structure of the set of HAR structures.

In an embodiment, the method further includes an image acquisition with a high-resolution scanning electron microscope and an identification and localization of the internal structure of at least one HAR structure including a core and at least one layer around the core.

In an embodiment, the method further includes performing extraction of at least one deviation parameter from the contours of the internal structure of the at least one HAR structure and analyzing the deviation parameter.

In an embodiment, the method further includes a step of fabrication process characterization, fabrication process optimization or/and fabrication process monitoring.

An apparatus according one embodiment of the disclosure is semiconductor inspection device, including a focused ion beam device (FIB) adapted for milling of a series of cross sections of an integrated semiconductor sample, a scanning electron beam microscope (SEM) adapted for imaging of the series of cross sections of the integrated semiconductor sample, and a controller for operating a set of instructions, capable of performing steps according to at least one embodiment of the method, wherein the focused ion beam (FIB) and the electron beam microscope (SEM) form an angle of about 90° with one another.

In an embodiment, a method of wafer inspection includes the steps of obtaining a 3D volume image of an inspection volume inside the wafer and selecting a set of templates representing cross sections of semiconductor features of interest in the inspection volume. The semiconductor features of interest can include one of the following: a metal line, a via, a contact, a fin, a HAR structure, a HAR channel or a gate structure. The method further includes determining center positions of cross section of semiconductor features of interest within the inspection volume, for example by correlating the templates with a set of 2D cross section images of the 3D volume image. The method further includes the step of determining contours of semiconductor features of interest within the 3D volume image and the step of determining parameters of at least a representative primitive, the primitive matching the contours of semiconductor features of interest. The method further includes the step of analyzing the parameters. In an example, the method further includes the step of assigning a subset of the plurality of cross section of semiconductor features of interest to a specific semiconductor feature of interest. The method can further include the step of generating the 3D volume image from a sample piece by a slice and image method utilizing a dual beam system. The dual beam system can include a FIB beam for slicing and a charged particle imaging microscope for imaging, for example a SEM or a HIM (Helium Ion Microscope). The method can further include the step of lift out of a sample piece from a wafer and holding the sample piece. The step of lift out can include a step of attaching the sample piece to a probe needle, moving the sample piece, and attaching the sample piece to a holder. In an example, the step of lift out of the sample piece from the wafer is performed in the dual beam device. The dual beam device can further include a LASER beam device configured for cutting the semiconductor sample from the wafer and the method can include performing a Laser cut into the wafer. The step of analyzing the parameters can include at least one of a computation of a statistical average and a statistical deviation, a comparison to a reference primitive, or a correlation with a wafer coordinate. As a result, a set of deviation parameters can be obtained. According to an embodiment, the method includes classifying the deviation parameters as a certain type of defect. Examples for such classes of defects are "alignment error", "distorted shape", "too small distance", "too small diameter" etc.

According to an aspect of the disclosure, the disclosure is directed to a computer program product with a program code adapted for executing any of the methods as described above. The code can be written in any possible programming language and can be executed on a computer control system. The computer control system as such can include one or more computers or processing systems.

According to an aspect of the disclosure, the disclosure is directed to a semiconductor inspection device adapted to perform any of the methods according to any one of the embodiments as described above.

BRIEF DESCRIPTION OF THE DRAWINGS

The present disclosure includes the following drawings, in which:

FIGS. 4A and 4B show deviations of a pillar from ideal shape and form;

FIG. 5 shows method steps according an embodiment of the disclosure;

DETAILED DESCRIPTION

Figure 1A:
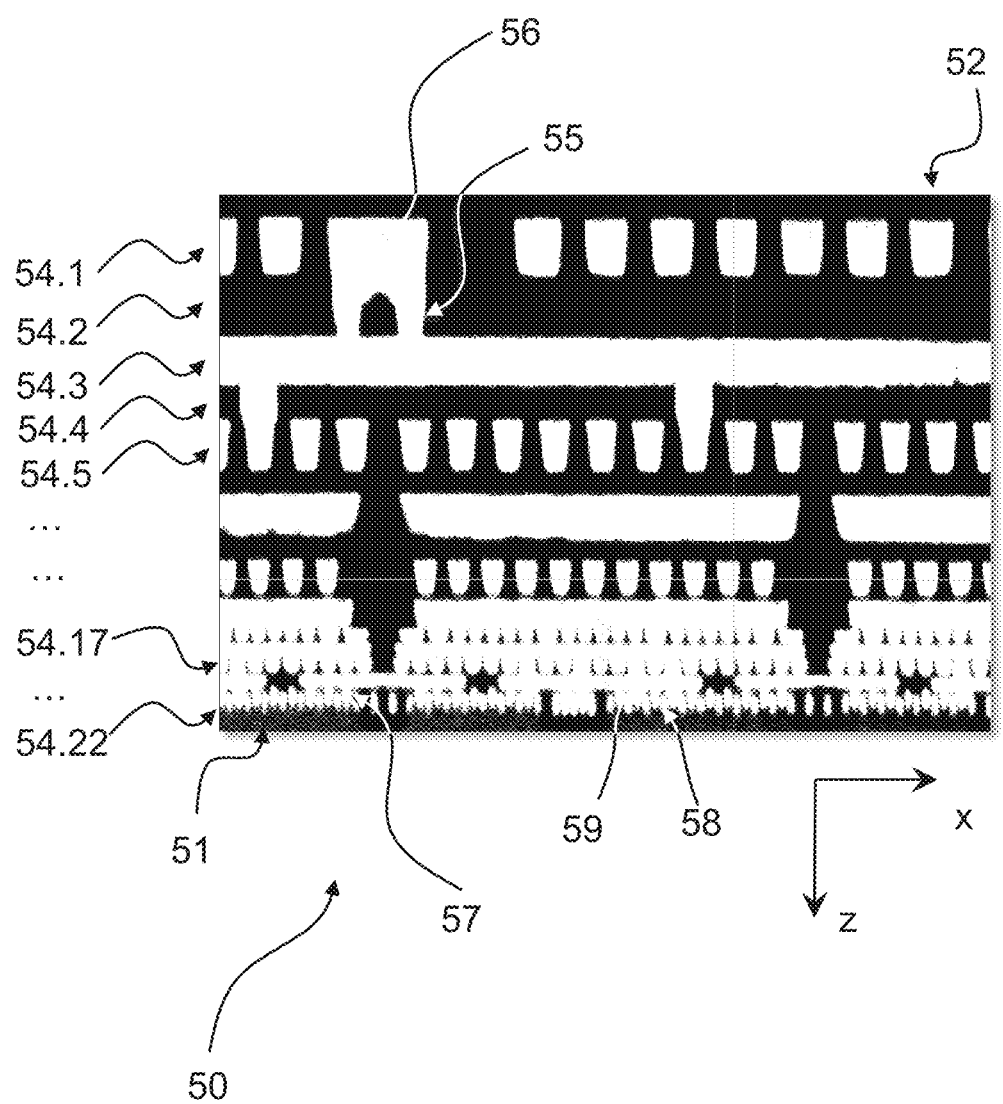
FIGS. 1A and 1B illustrate a semiconductor device.
Figure 1B:
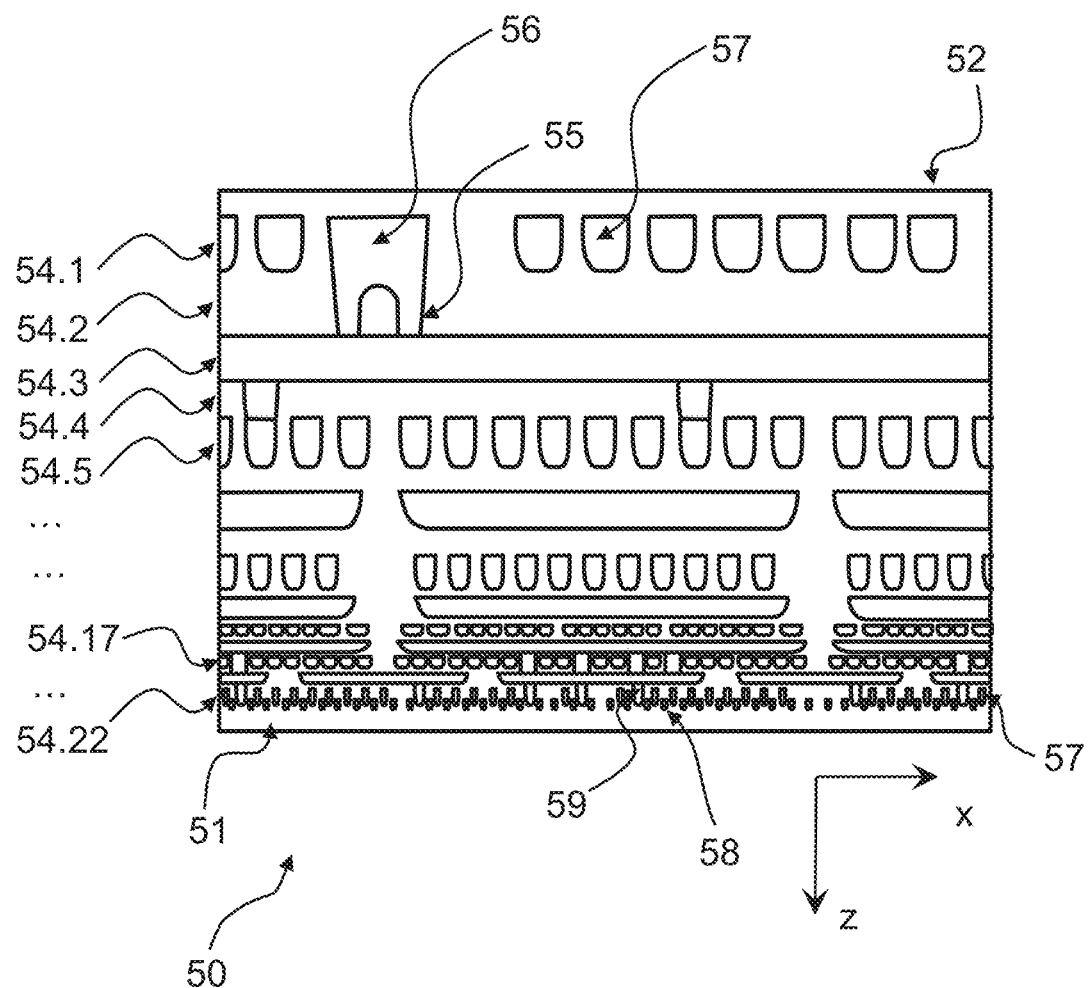
Figure 2:
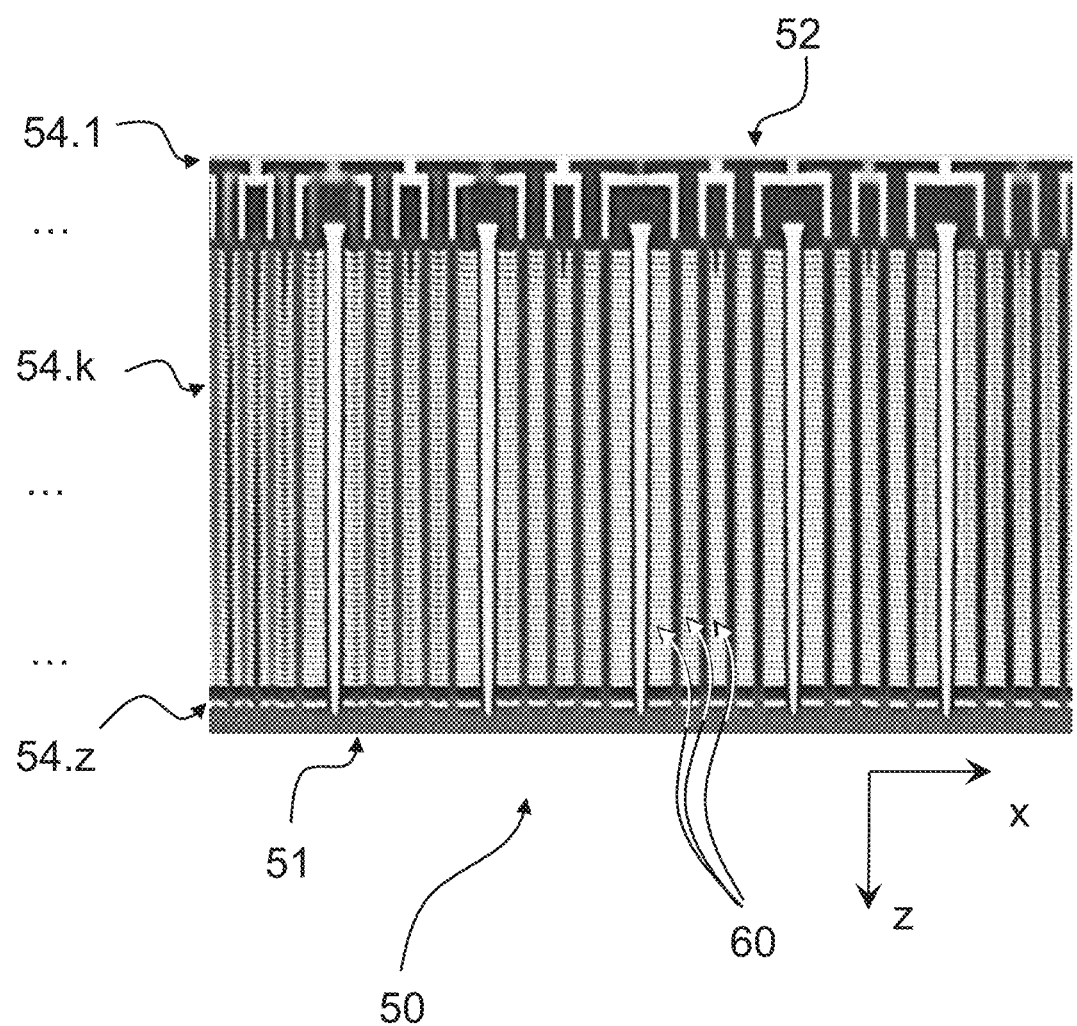
FIG. 2 shows a cross section of NAND device.

HAR structures, also commonly referred to as "pillars", "holes" or "channels", are fine, often pillar like and elongated structures extending through significant parts of the integrated semiconductor sample, oriented perpendicular to the metal layers. Throughout the disclosure, the terms "HAR structures", "channels" or "pillars" will be used as synonyms. Typical examples of HAR structures are shown in FIG. 2 in an image through a semiconductor memory device 50, such as a NAND memory device. HAR structures, such as the pillars or HAR structures, of which three are indicated by reference number 60, are part of memory cells, where charge is injected, held or measured, and erased in integrated electronic devices. The HAR structures are manufactured during fabrication of the integrated semiconductor in a sequence of adjacent layers 54.1, . . . , 54.k, . . . , 54.z and build from a sequence of segments stacked on top of each other. Examples of HAR structures are filled with insulating or conducting or semiconducting material, or a combination of both. Other examples of HAR structures are empty of any material (unfilled holes).

Figure 3A:
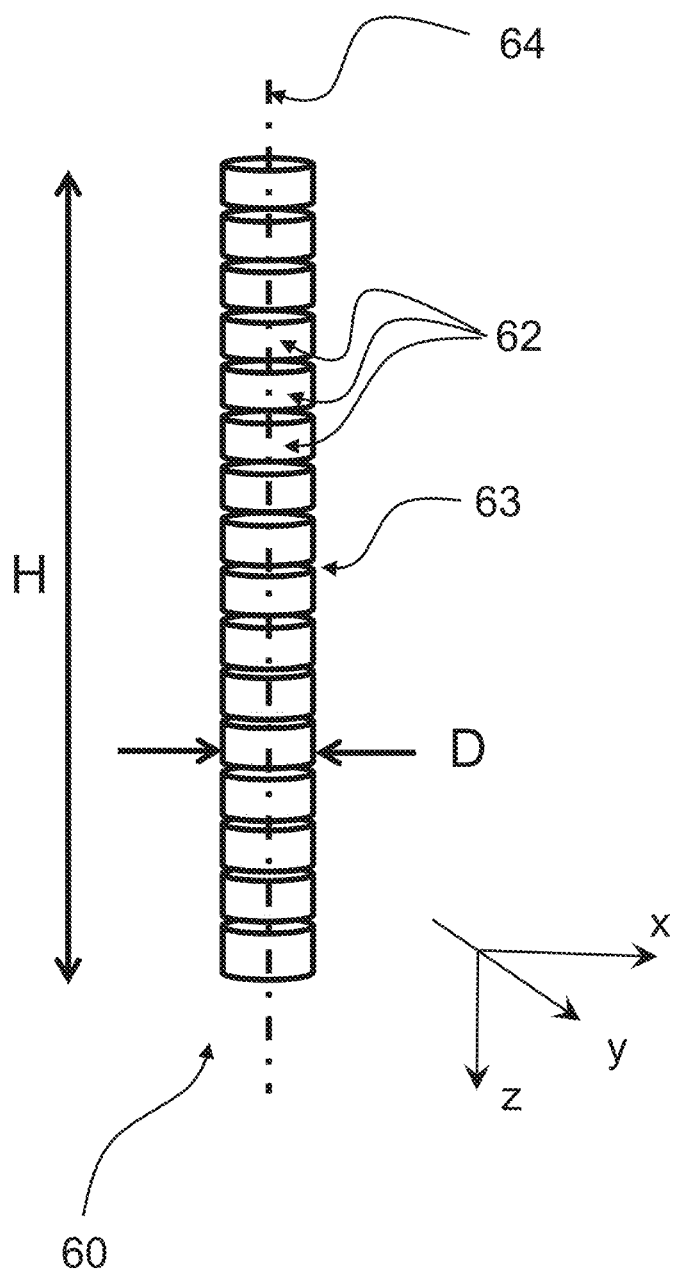
FIGS. 3A and 3B show a pillar and pillar cross section, respectively.
Figure 3B:
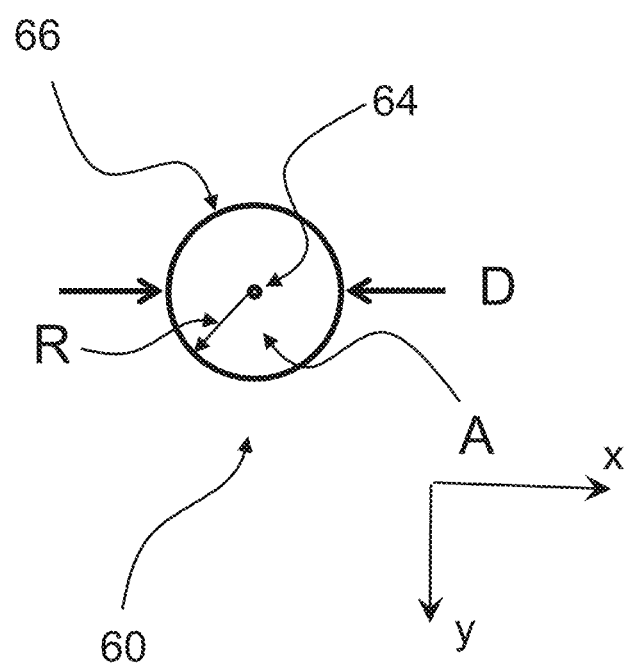

An example of an individual HAR structures 60 is illustrated in FIGS. 3A and 3B. In this example, a sequence of segments (three shown as pillar segments 62) are formed on top of each to form the long and thin pillar 60. The segments may be separated by thin gaps 63. In another example, not shown, a series of empty segments may be formed as a long, thin hollow pillar and filled afterwards. HAR structures having a high aspect ratio (HAR), with height H significantly greater than diameter D. Typical aspect ratios are H/D>5, with a height H, ranging from 10's of nm to about 10 um (micrometer) and a diameter, D, ranging from few nm to about 1 um (micrometer). In this example, illustrated in FIG. 3B in cross section perpendicular to the z-axis, the shape of an outer contour 66 of the HAR structure 60 is circular. The trajectory 64 of the pillar 60 is parallel to the z-direction and at the center of gravity of the circular shape of the outer contour 66 of the cross section illustrated in FIG. 3B. For an ideal pillar 60, at each z-position, the design area A of the cross section inside the contour 66 is constant. In addition to the diameter D, the radius R of an ideal circular cross section, half of the diameter D, is constant through the pillar.

Figure 4A:
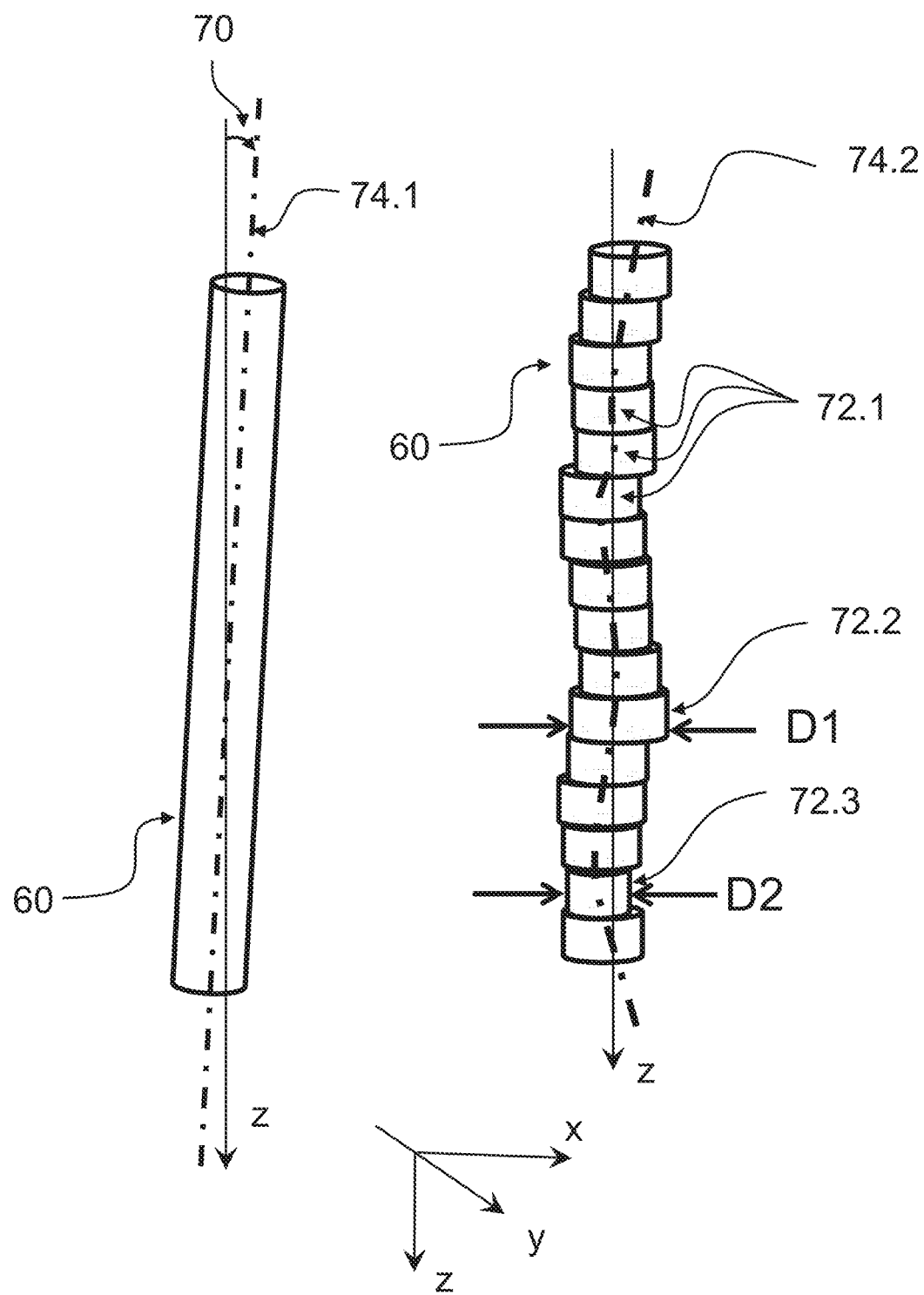

HAR Structures are for example formed by a large series or small metal structures in each subsequent layer, stacked on top of each other. The HAR Structures thus can suffer from several damages or deviations, thus as errors in the processing of individual planar layers as well as overlay errors between subsequent planar layers. Errors or defects within the HAR structures, however, limit the performance of a semiconductor device or may cause failure of such a device. FIG. 4 shows examples of such defects in a simplified model. FIG. 4A shows the effect of placement or overlay errors. For example, due to systematic alignment errors between individual layers of the integrated semiconductor, the trajectory 74.1 of a HAR structure 60 is inclined by an angle Θ (70) relative to the z-axis, as illustrated on the left half of FIG. 4a. In the example illustrated on the right side, the trajectory 74.2 of a non-linear or twisted shape is a consequence of statistical alignment errors. Due to statistical random alignment errors between individual layers of the integrated semiconductor, the pillar segments, from which three are illustrated by 72.1, may be laterally displaced. Consequently, the trajectory through the centers of gravity of each cross section of the pillar 60 deviates from a design trajectory and can reach a maximum deviation $T_{max}$ (not shown).

In addition, the pillar segments, such as the segment 72.2 with larger diameter D1 or the segment 72.3 with smaller diameter D2<D1, can deviate from the ideal design size and circular shape and thereby cause also a change in the lateral position of the trajectory 74.2. Such deviations in lateral size and shape are illustrated in FIG. 4B. The upper half illustrates a contour 76.1 of elliptical shape with diameters Dx(z) and Dy(z) of the HAR structure 60 at the z-position of the cross section, the lower half illustrates a general deviation of the circumferential shape 76.2 of a cross section from the ideal circular shape 66 of HAR structure 60. The contour 76.2 shows varying diameters in different directions with a minimum diameter D3. Such errors or deviations can arise from fabrication errors in the planar integration techniques, for example due to lithography mask or imaging errors. The HAR structures may also be only partially filled with material or a filling with wrong material may have occurred, or gaps within the HAR structure 60 may exist. This defects or inclusions can be throughout a pillar or locally confined to a smaller range in direction along the pillar (z-direction). As an effect, the cross-section area A(z) of the HAR structure may deviate from the design area A and change over z, and may have a minimum area $A_{min}$ at a specific z-position.

The amount of the deviations from ideal or design parameters is of importance for fabrication process development and characterization of fabrication processes for an integrated semiconductor device. Deviations can be indicators for process yield and process stability and thus reliability, as well as reliability and performance of an integrated semiconductor device itself. In an embodiment of the disclosure, the amount of deviation from ideal or design parameters such as trajectories $T(Z)$ or cross section area $A(z)$ is measured. An implementation of the method according the disclosure is illustrated at FIG. 5. The method includes analyzing a set of HAR structures within an integrated semiconductor device, including obtaining a 3D tomographic image of a semiconductor sample, selecting a subset of 2D cross section image segments from the 3D tomographic image, each including cross section images of a set of HAR structures, identification of a contour of each HAR structure within the set of HAR structures in the subset of 2D cross section images, extraction of deviation parameters from the contours of the HAR structures of the set of HAR structures, and analyzing the deviation parameters. The derivation parameters include one or more of a displacement from an ideal position, a deviation in radius or diameter, a deviation from a cross section area, a deviation from a shape of a cross section.

In step S1, a sample of a semiconductor device is loaded into a microscope chamber. The microscope will be explained below in more detail. First, the integrated semiconductor sample is prepared for the subsequent tomographic imaging approach by methods known in the art. The sample may have been generated by breaking of a semiconductor wafer, or any other methods known in the art, like laser cutting. As an alternative, the sample can also be prepared from a semiconductor wafer inside the microscope chamber by laser cutting or charged particle beam milling techniques known in the art. Either a groove is milled in the top surface of an integrated semiconductor to make accessible a cross section approximately perpendicular to the top surface, or an integrated semiconductor sample of block shape is cut out and removed from the integrated semiconductor wafer. This process step is sometimes referred to as "lift-out". The sample lift out from a wafer for further investigation has preferably a shape of a cuboid or block with size of up to few millimeters, preferably the size is about few 100 μm. The sample is then prepared for the subsequent tomographic imaging step S2. The preparation can include an alignment and registration of the sample, an initial milling and polishing of selected surfaces of the sample, deposition of protective layers, as well as the generation of fiducial markers on surfaces of the sample. Surfaces for fiducials can be at least a single side surfaces or two or more surfaces of the sample.

In step S2, a 3D volume image of the sample is generated by a tomographic imaging approach. A common way to generate 3D tomographic data from semiconductor samples on nm scale is the so-called slice and image approach elaborated for example by dual beam or cross beam device. In such a semiconductor inspection device, two particle optical systems are arranged at an angle. The first particle optical system can be a scanning electron microscope (SEM), adapted for imaging of the series of cross sections of the integrated semiconductor sample. The second particle optical system can be a focused ion beam optical system (FIB), using for example gallium (Ga) ions and adapted for milling of a series of cross sections of an integrated semiconductor sample. The semiconductor inspection device further includes a controller for operating a set of instructions, capable of performing steps according to at least one embodiment of the method.

The 3D tomographic data generation method, obtaining at least first and second cross section images includes subsequently removing a cross section surface layer of the integrated semiconductor sample with a focused ion beam to make a new cross section accessible for imaging, and imaging the new cross section of the integrated semiconductor sample with a charged particle beam. The focused ion beam (FIB) of Ga ions is used to cut off layers at an edge of a semiconductor sample slice by slice and every cross section is imaged using for example a high-resolution scanning electron microscope (SEM) with a resolution of few nm. The two particle optical systems FIB and SEM might be oriented perpendicular at an angle of about 90° to each other or at an angle between 45° and 90°. From the sequence of 2D cross section images, a 3D image of the integrated semiconductor structure is reconstructed. The distance dz of the 2D cross section images can be controlled by the FIB milling or polishing process and can be between 1 nm and 10 nm, preferably about 3-5 nm. Throughout the disclosure, "cross section image" and "image slice" will be used as synonyms.

Figure 6A:
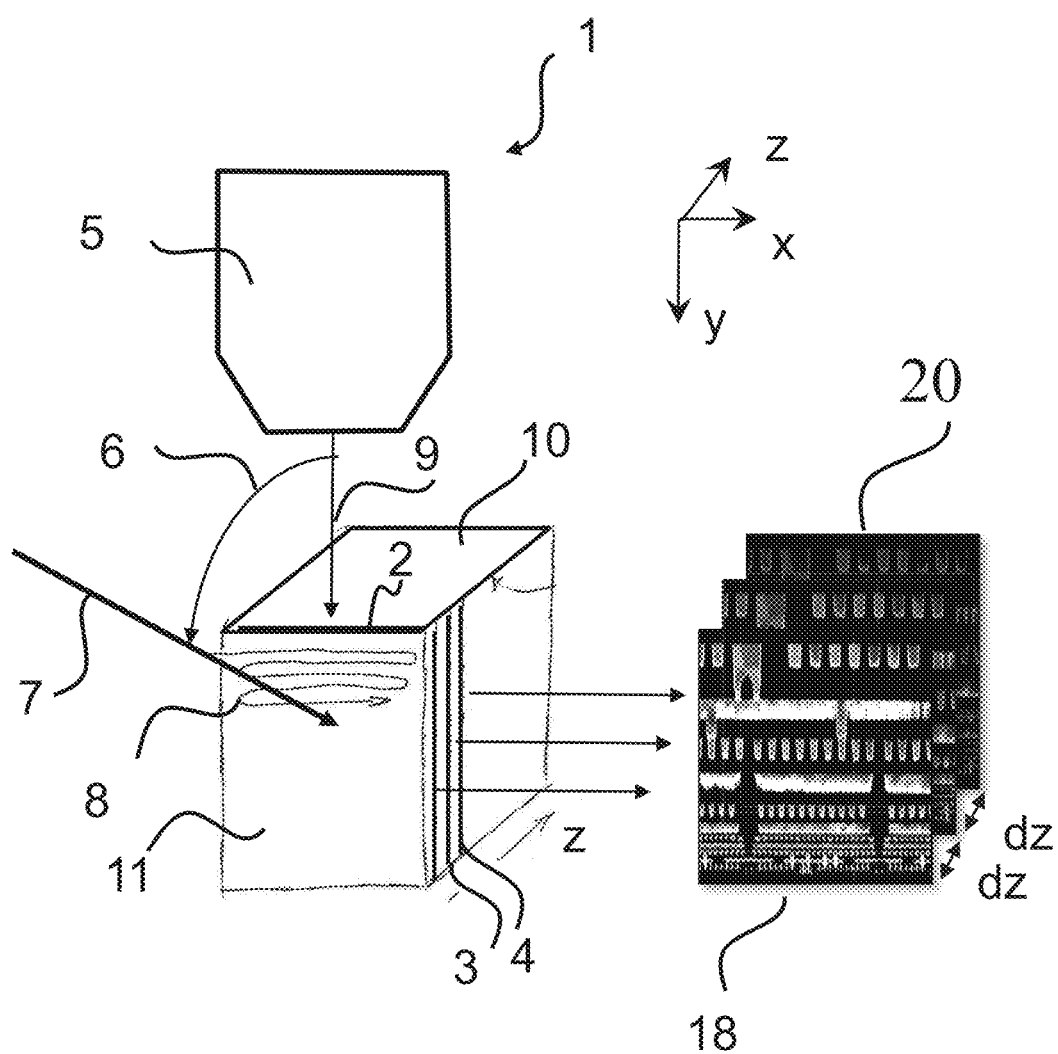
FIGS. 6A and 6B show a cross beam microscope and slice- and image method, respectively.

FIG. 6A shows a schematic view of the slice and image approach to obtain a 3D volume image of an integrated semiconductor sample with a cross beam microscope 1. With the slice and image approach, three-dimensional (3D) volume image acquisition is achieved by a "step and repeat" fashion. For sake of simplicity, the description is shown at a block shaped integrated semiconductor sample 10, but the disclosure is not limited to block shaped samples 10. This slice of material may be removed in several ways known in the art, including the use of a focused ion beam milling or polishing at glancing angle, but occasionally closer to normal incidence by focused ion beam (FIB) 5. For example, the ion beam 9 is scanned along direction x to form a new cross section 2. As a result, a new cross section surface 11 is accessible for imaging with a CPB (not shown) with scanning electron beam 7. The cross-section surface layer 11 is raster scanned by a charged particle beam (CPB), for example the electron beam 7, but also a second FIB can be used for imaging. A simplified raster of scanning imaging lines 8 is illustrated. The optical axis of the imaging system can be arranged to be parallel to the z-direction, and thus be perpendicular to the axis of the FIB 5, or inclined at an angle 6 to the FIB-axis or y-direction. CPB systems have been used for imaging small regions of a samples at high resolution of below 2 nm. Secondary as well as backscattered electrons are collected by a detector (not shown) to reveal a material contrast inside of the integrated semiconductor sample, and visible in the cross-section image 18 as different grey levels. Metal structures generate brighter measurement results. The surface layer removal and the cross-section image process are repeated through cross section 3 and 4 and further surfaces at equal distance dz, and a sequence of 2D cross section images 20 through the sample in different depths is obtained to build up a three-dimensional 3D dataset. The distance dz between two subsequent image slices can be 1 nm-10 nm. For high precision reconstruction, image registration is carried out which generally refers to precision placement of cross section images in 3D volumes. Image registration can for example be carried out referring to positional markers or to so-called feature-based registration. Such a 3D volume image generation is described in German patent application DE 10 2019 006 645.6, filed on Sep. 20, 2019, which is hereby fully incorporated by reference. The representative cross section image 18 is obtained by measurements of a commercial Intel processor integrated semiconductor chip with 14 nm technology. The cross-beam microscope 1 also includes several other devices and units, such as a stage with several degrees of freedom for positioning and moving of the sample, detectors, gas sources for deposition, an overview camera for navigation, manipulators to manipulate the sample, enclosures including a vacuum chamber, valves and ports, power supply and control devices to control the cross-beam microscope 1.

Figure 6B:
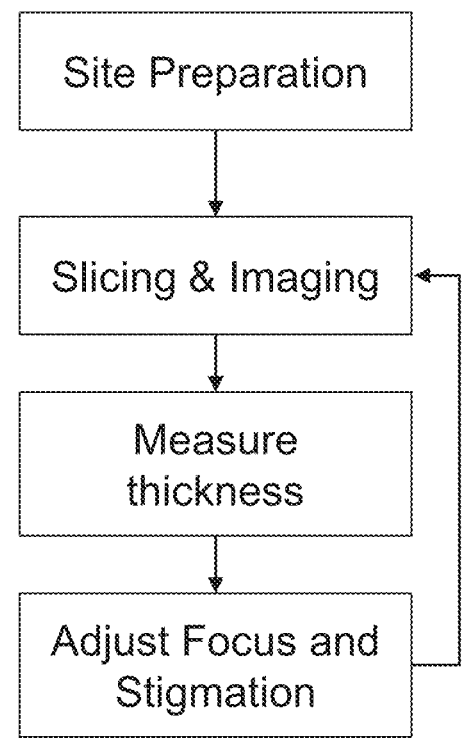

FIG. 6B further illustrates the cross-section imaging workflow. The process starts with a respective site preparation as already explained above. Then, a stack of 2D cross section images is created by serial FIB sectioning and imaging with a charged particle beam. During milling and imaging, the thickness of the slices is measured, and it is possible to adjust focus and stigmation of the charged particle lens as well as the FIB, leading to optimized slicing and imaging results. The step of stigmation is well known in the art and means the adjustment of focus and spot size, for example a fine tuning of the charged particle beam column to minimize aberrations like astigmatism. From the stack of 2D cross section images, a 3D data set can be determined. The cross-section images are registered and aligned with high precision to one another, for example by the method described in the above-mentioned German patent application DE 10 2019 006 645.6.

Figure 17:
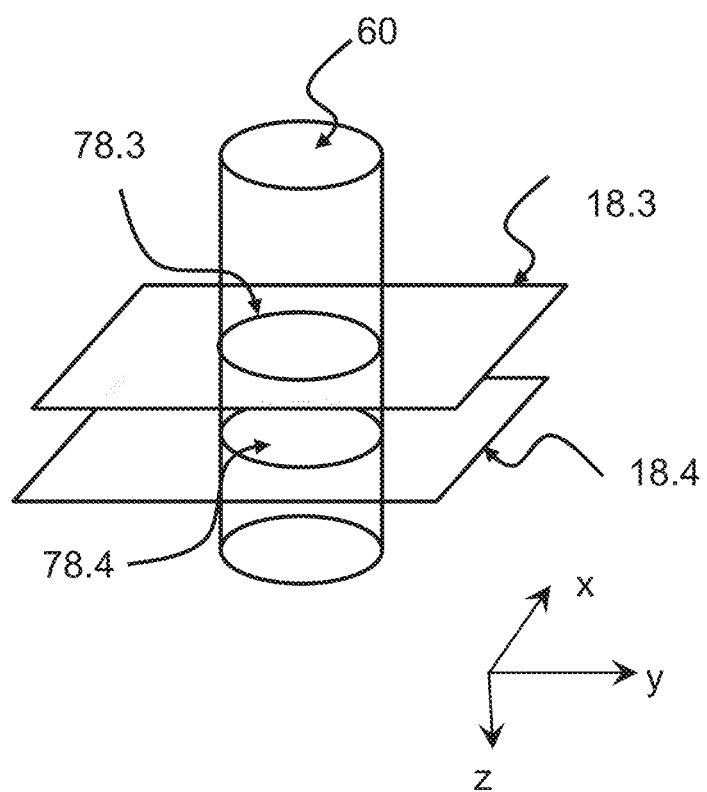
FIG. 17 shows a simplified illustration of 2D cross section image slices through a pillar.

FIG. 17 illustrates a simplified example of a cross section imaging method at a pillar or HAR structure. A sequence of 2D cross section images or image slices is generated, including the two 2D cross section images 18.3 and 18.4. Each includes a cross section of the semiconductor feature of interest, in this example pillar 60, for example cross section 78.3 and 78.4.

The described 3D tomography has several advantages: It is possible to image 3D structures in their entirety. These structures can be, but are not limited to, HAR (high aspect ratio) memory channels, FinFETs, a metal line, a via, a contact, a fin or a gate structure etc. Furthermore, it is possible to review 3D volumes as cross sections from any direction to visualize a structure placement. In other words, arbitrary virtual cross section images can be generated. A 3D model can be determined from the 3D data set allowing visualization and measurement of 3D features in the 3D model from any direction. Additionally, it is possible to provide vast amounts of dimensional statistics in 2D and in 3D.

Figure 7A:
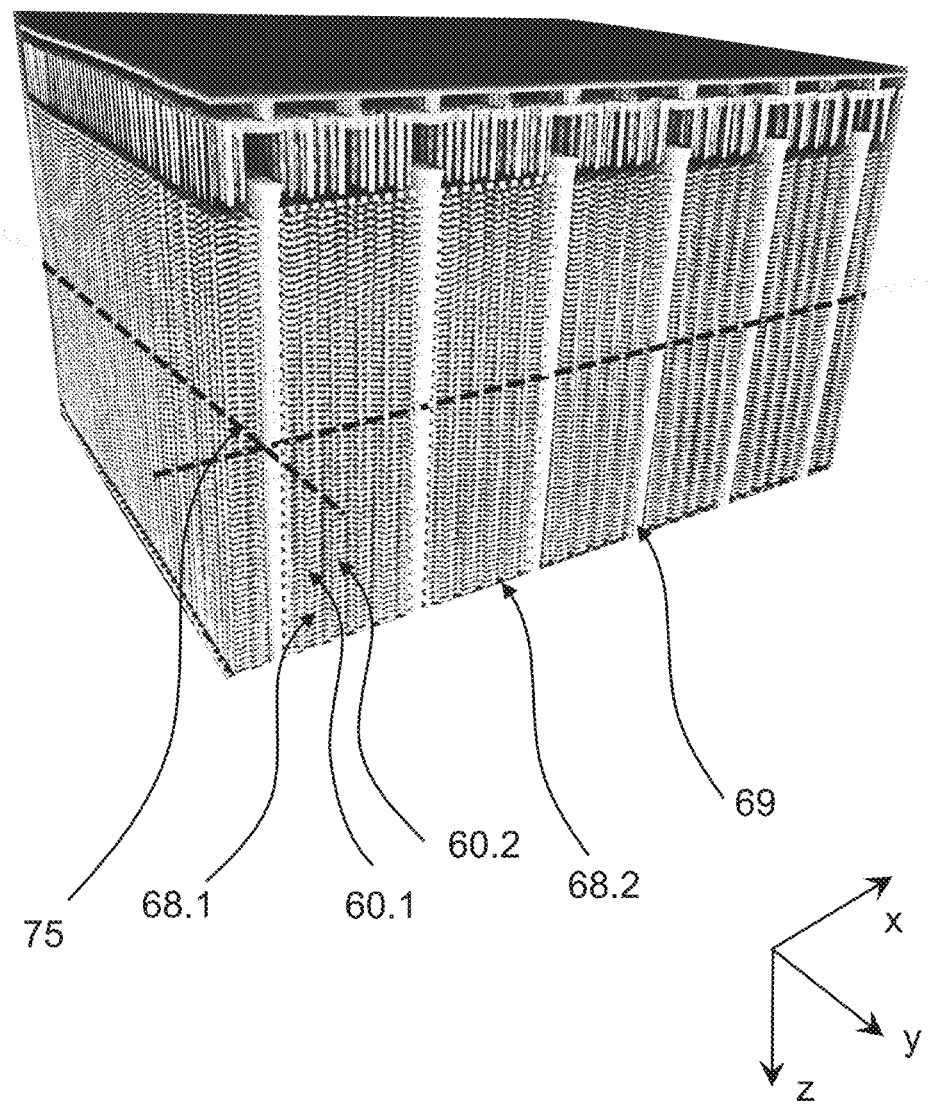
FIGS. 7A and 7B show a 3D volume image of a NAND structure and an intersection image, respectively.

FIG. 7A shows the 3D volume image of a NAND memory device, including several pillars including pillars 60.1 and 60.2. The NAND structure within the 3D volume image of the sample volume includes several sets or groups 68.1 or 68.2 of pillars or HAR structures, which are separated by structures 69.

Figure 7B:
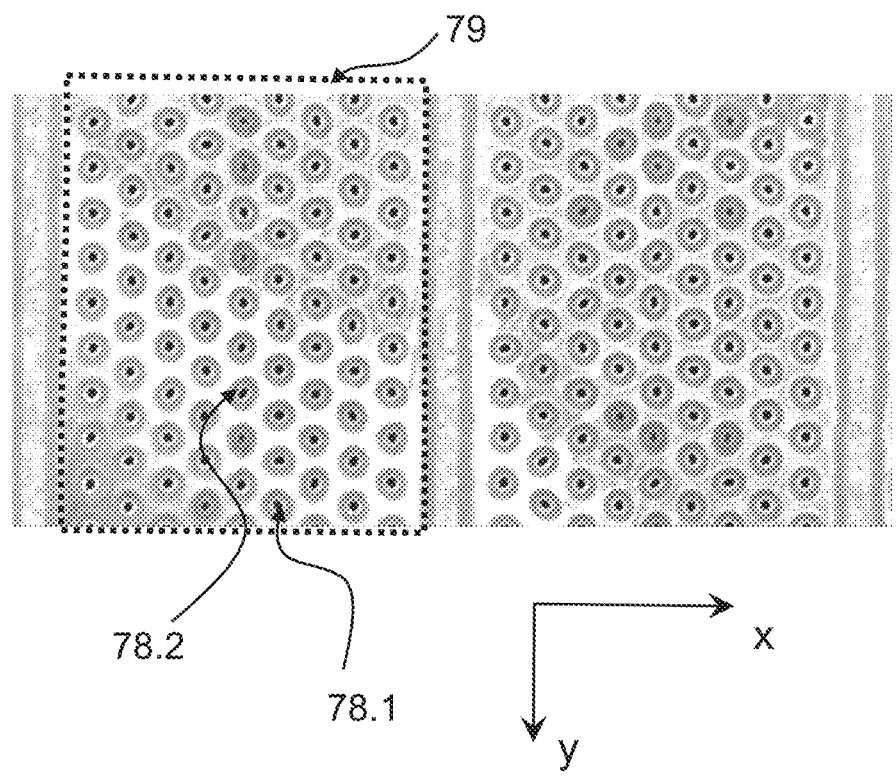

FIG. 7B shows a 2D cross section or intersection image of intersection plane 75 through the 3D volume image, parallel to the top surface of the NAND device, showing cross sections of several pillars including cross sections 78.1 and 78.2. The cross sections also show the cross section of groups of pillars or set of HAR structures, like the group 79 of pillars on the left side.

In step S3, a z-series of intersection images through the 3D volume image is selected. The selection can for example be done by user instructions utilizing a graphical user interface (GUI). For example, a user may select the six planes which form the boundaries of a cubic volume containing pillars. In another example of a routine inspection, the selection can be performed automatically based on programmed instructions in combination with a registration and image analysis of the 3D volume image. A user input may be desired to confirm the automated selection, or the user may perform fine adjustments via a graphics user interface. As a result, a group of pillars like group 68.1 or 79 is selected. A z-series of intersection images is extracted from the 3D volume image, each including several cross-section images such as 78.1 or 78.2 of at least one pillar 60, 60.1, or 60.2. The z-series of intersection images extends parallel to the long direction of HAR structures, thus parallel to the z-direction. Each intersection image of the z-series represents a x-y cross section 78.1 or 78.2 of at least one pillar 60, 60.1, or 60.2 in at a different z-coordinate. The z-series includes thus the intersection images of a set of HAR structures or pillars.

In one embodiment, the 3D-volume image is acquired in a so-called plane-view slice and imaging method, in which the semiconductor sample is milled and imaged layer by layer, beginning from the top layer of the semiconductor sample. Thus, a subset of 2D images obtained by the charged particle microscope corresponds to z-series including the cross sections of the pillars. In one embodiment, the image area plane-view slice and imaging method is selected to contain a predetermined set of pillars or HAR-structures, and the subsequently acquired 3D-volume image corresponds to the z-series of 2D cross-section image segments.

Figure 8:
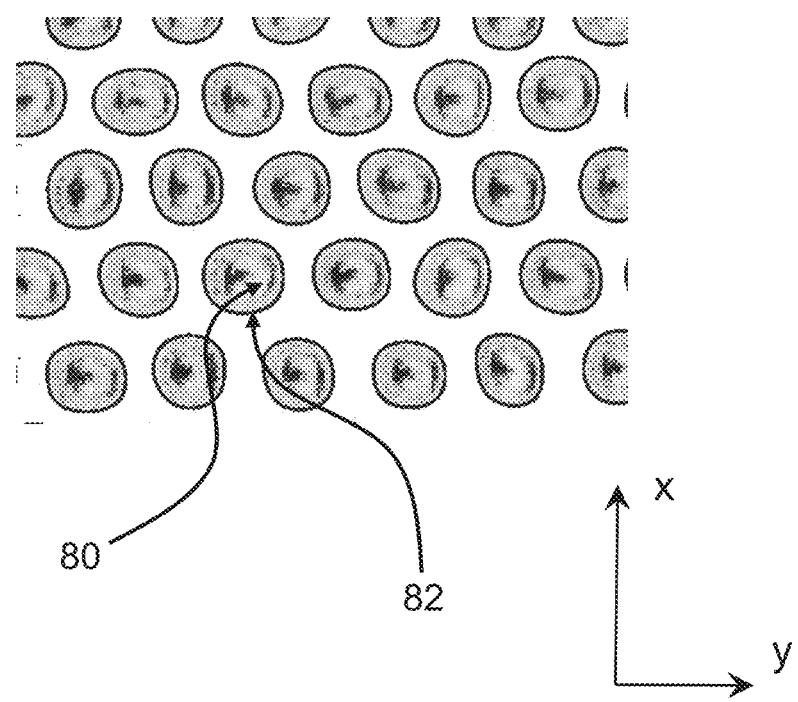
FIG. 8 shows a result of image processing and contour extraction.
Figure 9A:
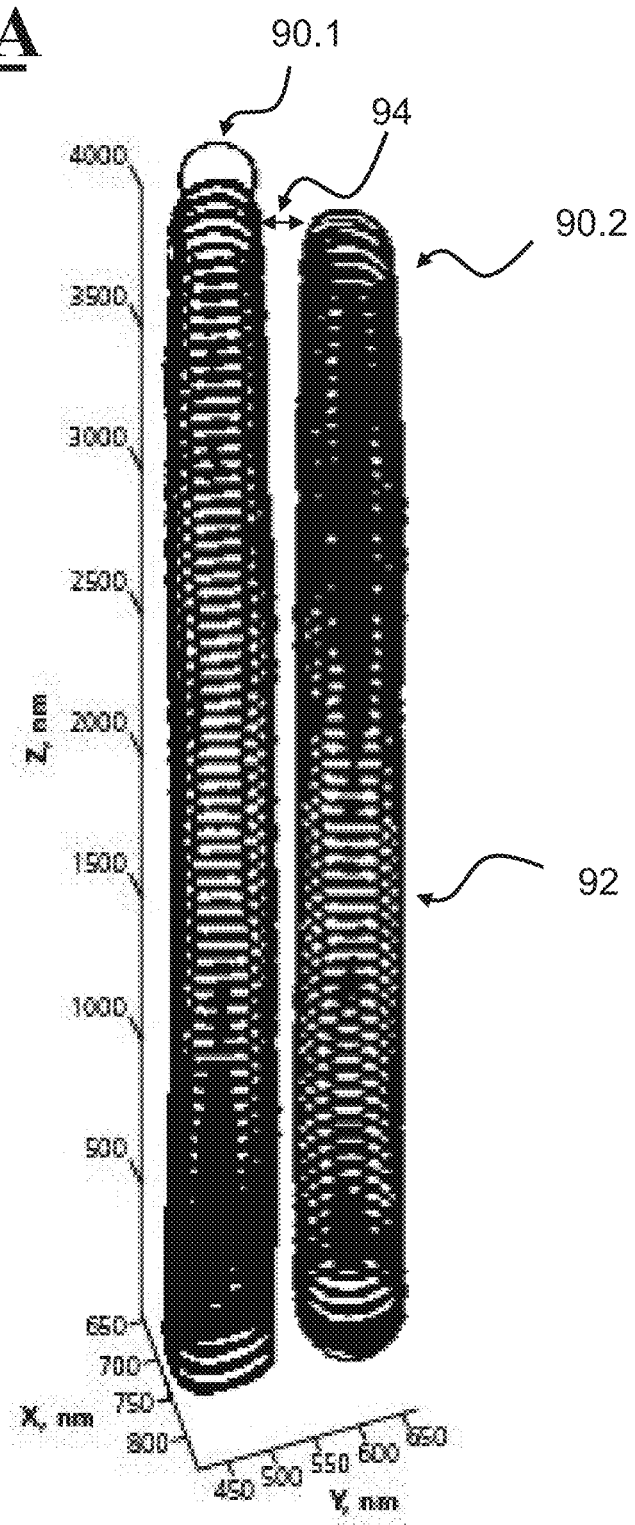
FIGS. 9A and 9B show a set of contours for two pillars and the distance between pillars, respectively.

In step S4, the cross sections of pillars of the set of HAR structures in the z-series of 2D intersection images are localized by image processing. Methods of image processing can include a contrast enhancement, a filtering, thresholding operations like clipping, edge detection by morphologic operations, or pattern recognition or combinations thereof or other methods, while all these methods are well known in the art. A result is shown in FIG. 8, showing a series of pillars after image processing. For example, pillar 80 is identified and the contour 82 of the pillar 80 is derived by edge detection. Other examples for contour extraction may be found in Image Contour Extraction Method based on Computer Technology from Li Huanliang, 4th National Conference on Electrical, Electronics and Computer Engineering (NCEECE 2015), 1185-1189 (2016). FIG. 9A shows the stack of contours 92 of the z-series of two pillars 90.1 and 90.2 of the selected group of pillars through z.

In step S5, the deviation parameters such as trajectory $T(z)$ or area $A(z)$ of the cross section of a pillar through the z-series is derived. It is understood that deviation parameters are either the differences of parameters versus a design or ideal parameter or a variation of a parameter for example through z or for several pillars, while the parameter should be constant through z or for several pillars.

Figure 10:
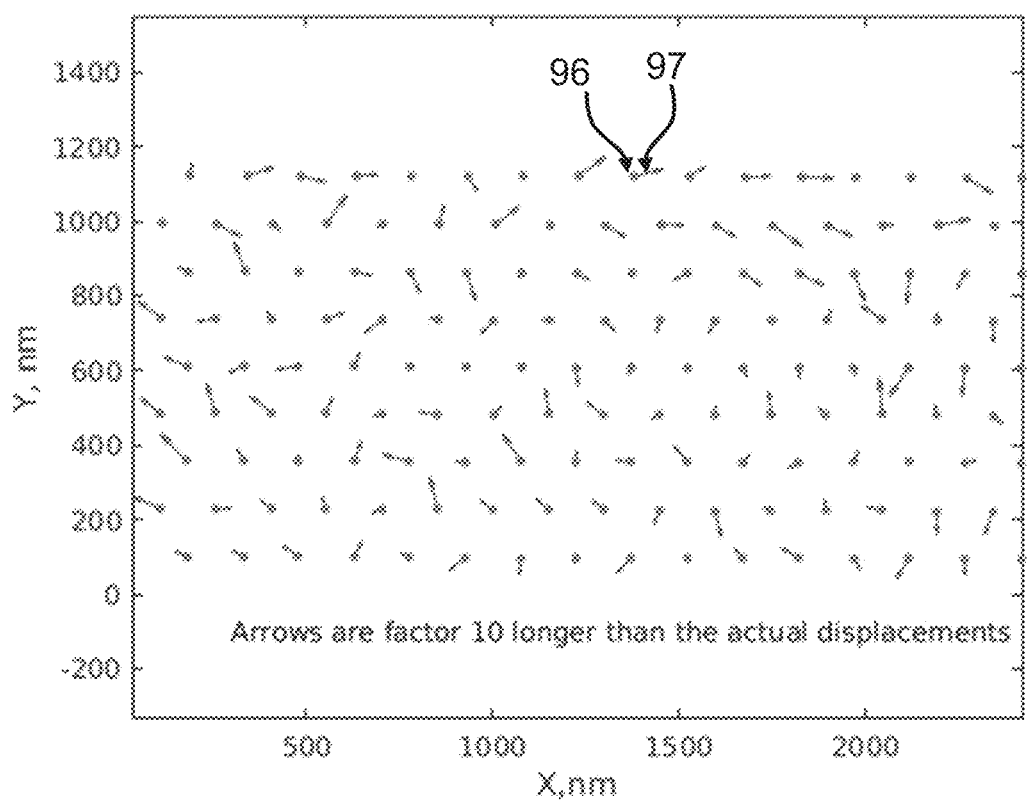
FIG. 10 shows displacement vectors for a set of pillars in one intersection plane.

First, the number and the centers of a series of pillars are computed in one z-position of the z-series. The centers may be computed by computation of the center of gravity of the cross-section image of a pillar, or by computation of the center of the contour by a geometrical or analytical approach known in the art. For example, a best fit circle or ellipse can be fit to the outer contour such as contour 82. The fitting of simplified geometrical forms such as circles or ellipses helps thereby to reduce the amount of data to describe the deviations of a pillar from ideal or design shape. For circles or ellipses, the centers are well known. From the center for each pillar and each z-position in the z-scan, the relative lateral displacement vectors of the centers of the pillar are derived. FIG. 10 shows the displacement vectors on enlarged scale for the pillars shown in FIG. 8.

Figure 11:
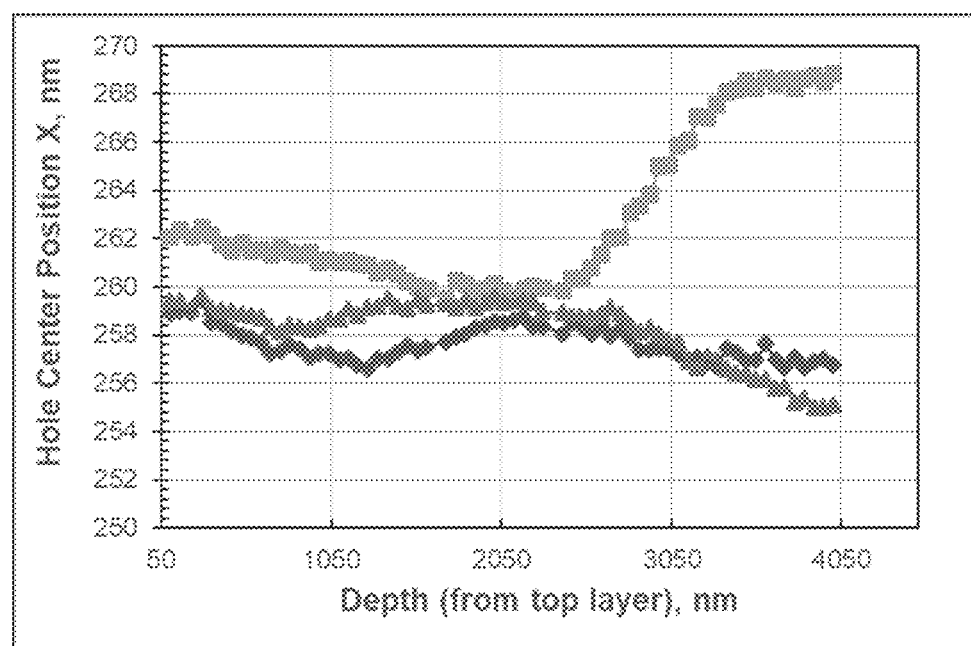
FIG. 11 shows a trajectory of three pillars (x-coordinate) through z.

The displacement can either be evaluated relative ideal pillar positions, shown as dots, with the ideal pillar position 96 of one pillar. The ideal pillar position can be derived from design or CAD data of the pillar positions, respectively, or by a best fit of a regular grid to the array of centers of pillars through all z-planes. A CAD data file may be in the GDSII (graphical design station/graphic data system II) format or OASIS (open artwork system interchange standard) format. A best fit can be achieved for example by minimization of the norm of the displacement vectors. The residual displacement vectors of one pillar, like the displacement vector 97, through the z-series together form the trajectory T(z) of the pillar though the 3D volume of the sample. FIG. 11 shows the x-component of the displacement vectors or trajectory T(z) of three pillars though the depth from top layer or in z-direction.

Figure 9B:
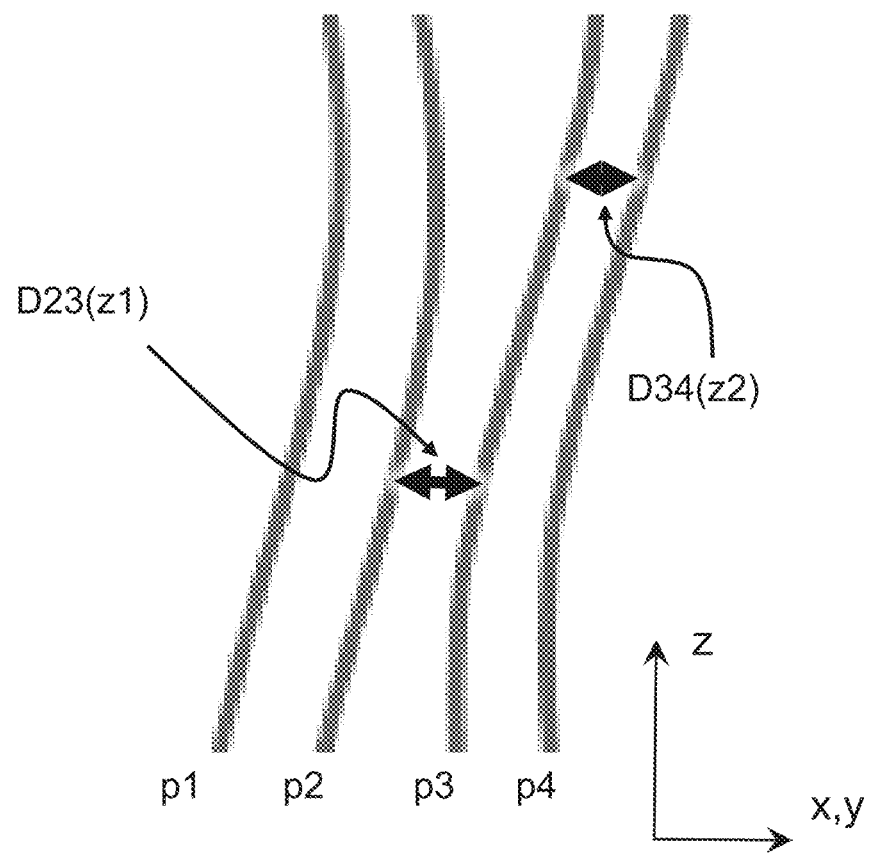

In an embodiment, the distance Dnm(z) between two pillars n and m is evaluated. As illustrated in FIGS. 9A and 9B, the minimum distance vector 94 between two contours 92 is computed as the minimum distance between two contours of two neighboring pillars 90.1, 90.2 by a geometrical or analytical approach. From the minimum distance vector, the distance Dnm(z) of the pillars through the z-series can be computed as a scalar function of z. FIG. 9B illustrates two minimum distance vectors D23(z1) or D34(z2) between pillars p2 and p2 or p3 and p4, respectively, at two z-positions z1 and z2. Neighboring structures with too small proximity are susceptible for diminished functionality or reliability of NAND devices.

Figure 12:
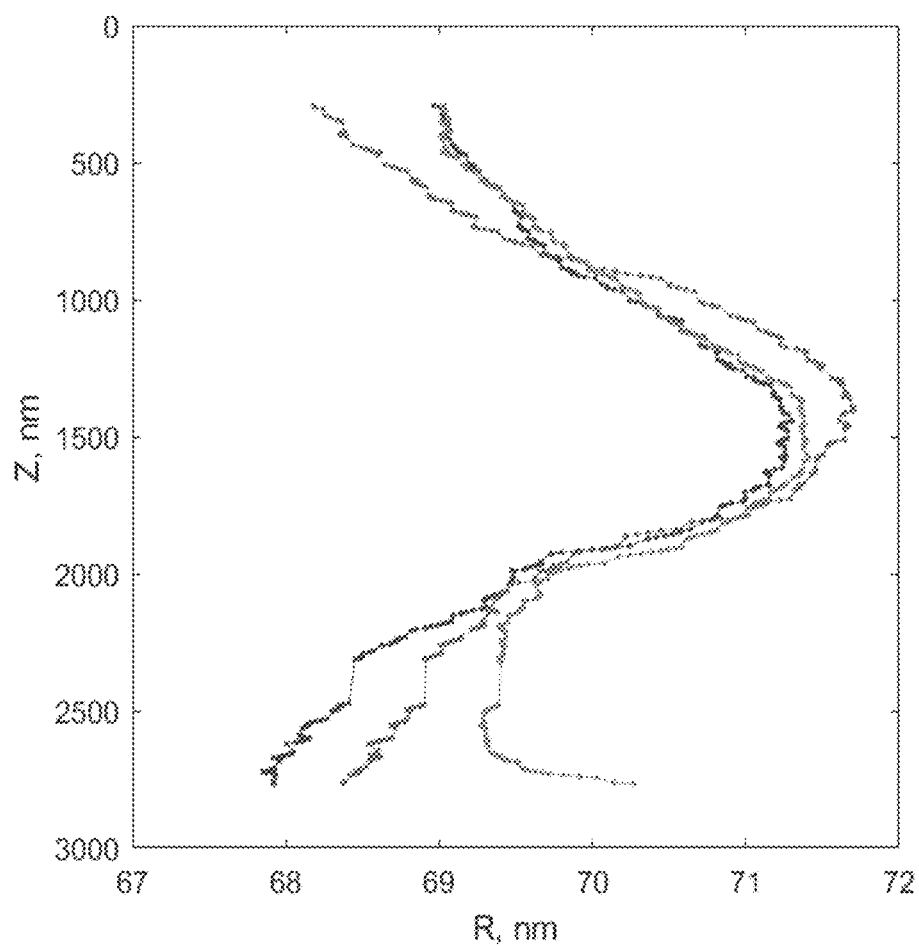
FIG. 12 shows a radius of contours of three pillars through z.

In an embodiment, step S5 includes the computation of the radius R(z) of the best fit circle to the contour of a pillar through z. The computation of the best fit circle can be performed by minimum distance method or other methods known in the art. FIG. 12 shows the obtained radius R(z) for 3 pillars though z.

Figure 13:
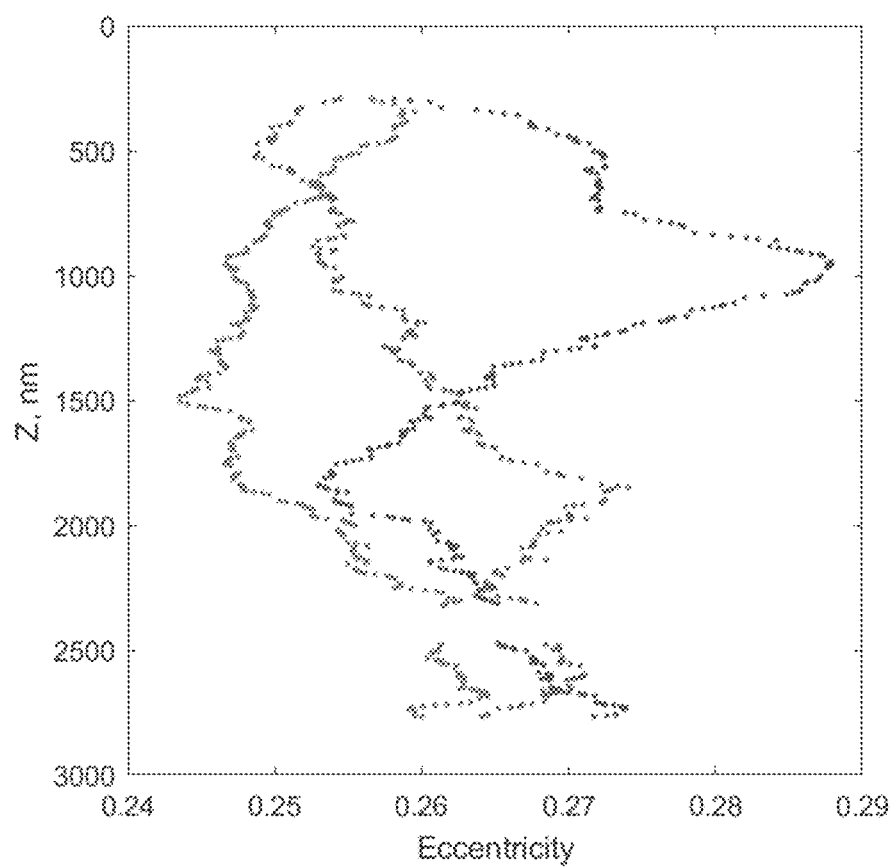
FIG. 13 shows eccentricity of contours of three pillars through z.

In an embodiment, step S5 includes the computation of the eccentricity E(z) of the best fit ellipse to the contour of a pillar. The computation of the best fit ellipse can be performed by minimum distance method or other methods known in the art. FIG. 13 shows the obtained eccentricity E(z) for 3 pillars though z.

In an embodiment, the method step S5 further includes the evaluation of the surface area A(z) enclosed by a contour out of the stack of 92. The evaluation can either be performed analytically from the best fit circles or best fit ellipses or performed by numerical integration of the area covered by a contour. In one embodiment, a volume V of a pillar can be computed from these stacks of contours 92, for example by integration of the areas A(z). In one embodiment, the minimum area $A_{min}$ is computed for each pillar or the deviation of the measured area A(z) from the design area is computed and illustrated as dA(z).

Figure 14:
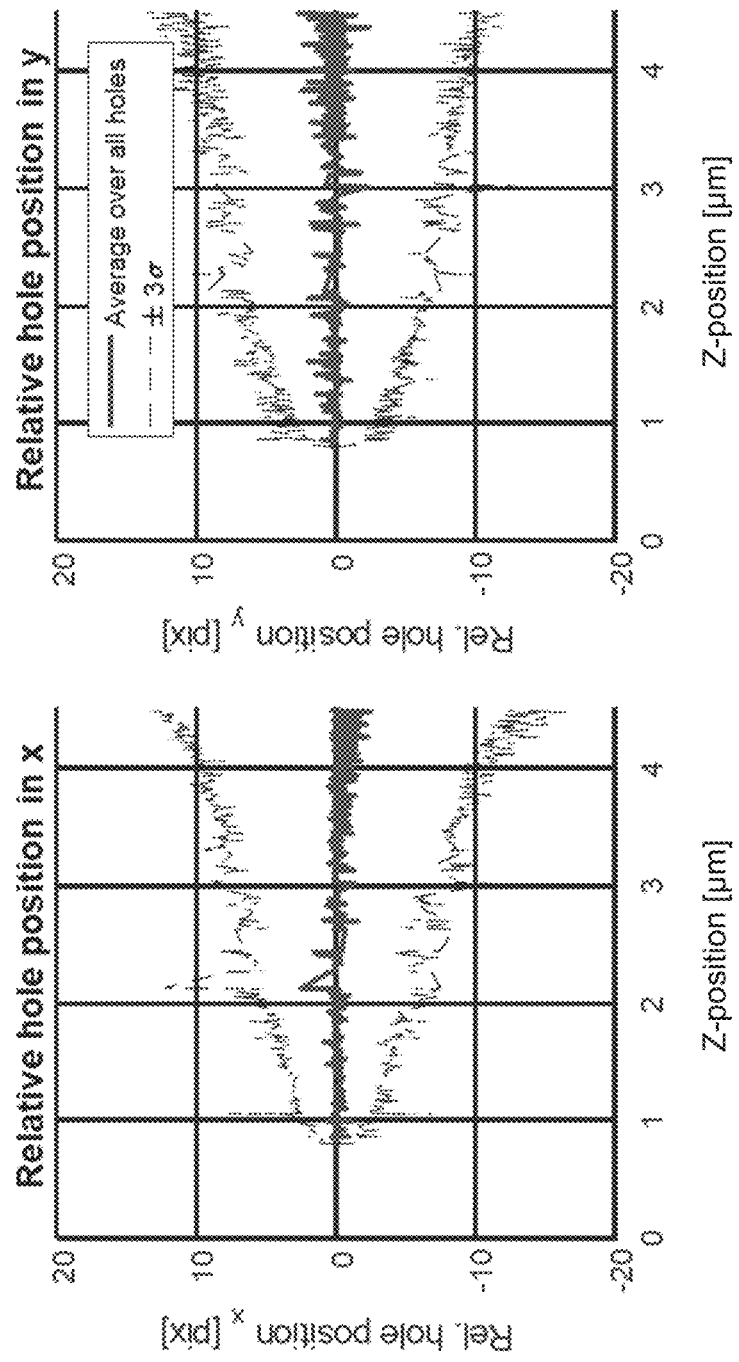
FIG. 14 shows statistical analysis of displacement vectors of a set of pillars through z.

In an embodiment, a step S6 follows. In this step S6, the data obtained by step 5 is further analyzed for example for statistical properties, inclination angles or maximum or minimum values. Such analysis is useful for process optimization as well as error tracking in the fabrication of integrated semiconductor devices. For example, an inclination angle of a pillar is computed by evaluating T(z) of one pillar, e.g. by gradient computation or derivation of T(z). Statistical analysis can include the analysis of the trajectories T(z) for many pillars, showing a mean value of deviation $T_{mean}(z)$ (as well as m the standard deviation on $T_{sigma}(z)$ for many pillars. FIG. 14 shows a result of mean value computation of a set of pillars through z, as well as the standard deviation increasing over z. In the same manner, deviations such as distance Dnm(z) of two neighboring pillars or areas A(z) or dA(z) of the pillars can be analyzed. This example demonstrates the stability of the planar integration techniques for semiconductor circuit fabrication, including the error propagation with increasing number of planar layers with increasing z-position.

In one embodiment, minimum or maximum values of deviations are computed. As one example, the minimum area $A_{min}$ for a pillar is evaluated as the minimum of A(z). The minimum area $A_{min}$ can be an indicator for resistance R of a pillar, with $R=\rho \cdot h/A_{min}$. Here, R is the resistance, $\rho$ is the resistivity, h is the length, and $A_{min}$ is the cross-sectional area. Another embodiment includes the computation of a global minimum area $A_{min,g}$ for all pillars. In another example, the maximum displacement $T_{max}$ for a pillar is evaluated as the maximum of the norm of T(z); another embodiment includes the computation of a global maximum deviation $T_{max,g}$ for all pillars.

In step S7, the analysis, and the result of the analysis such as the deviation parameters mentioned above, are listed or stored in a file, or a memory. The deviation parameters can be compared to thresholds or can be accumulated of a large set of inspection runs to generate a database of inspection results. If, for example the minimum distance $D_{min}$ is below a threshold, charge in the semiconductor device can leak and a block of pillars can be malfunctioning. A method according to the disclosure, however, allows to inspect semiconductor wafers with random samples during fabrication or during process development, and can indicate deviations from design or target values and thus allows a process control or process optimization. According to an embodiment, the method includes classifying the deviation parameters as a certain type of defect. Examples for such classes of defects are "alignment error", "distorted shape", "too small distance", "too small diameter" etc.

Figure 15A:
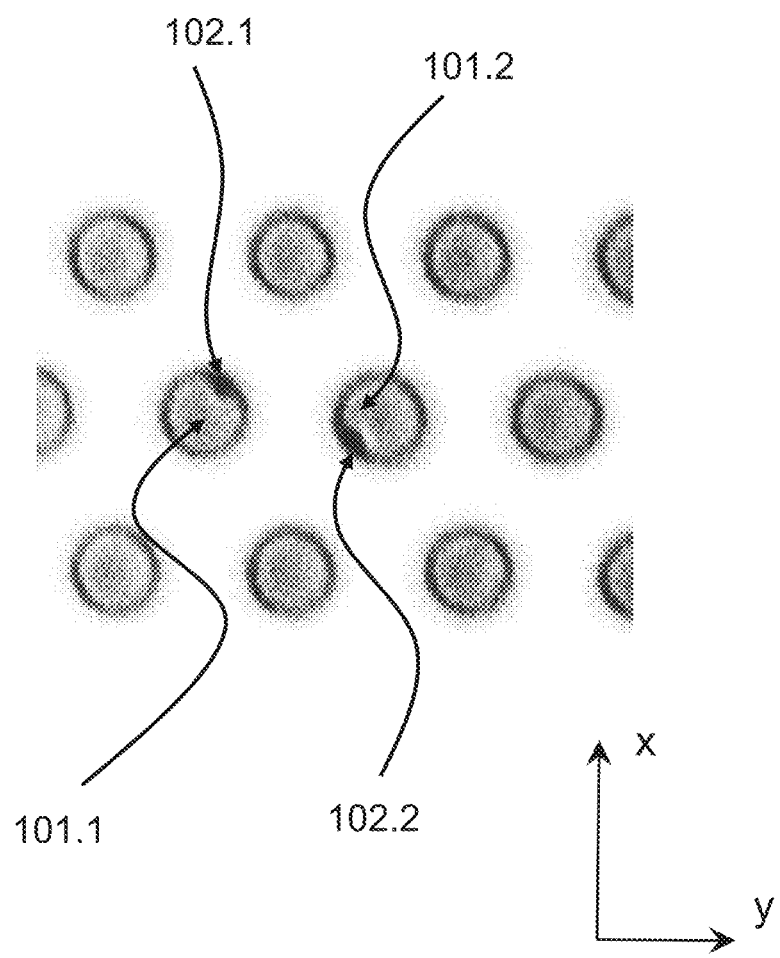
FIGS. 15A and 15B show inclusions or local defects of pillars.
Figure 15B:
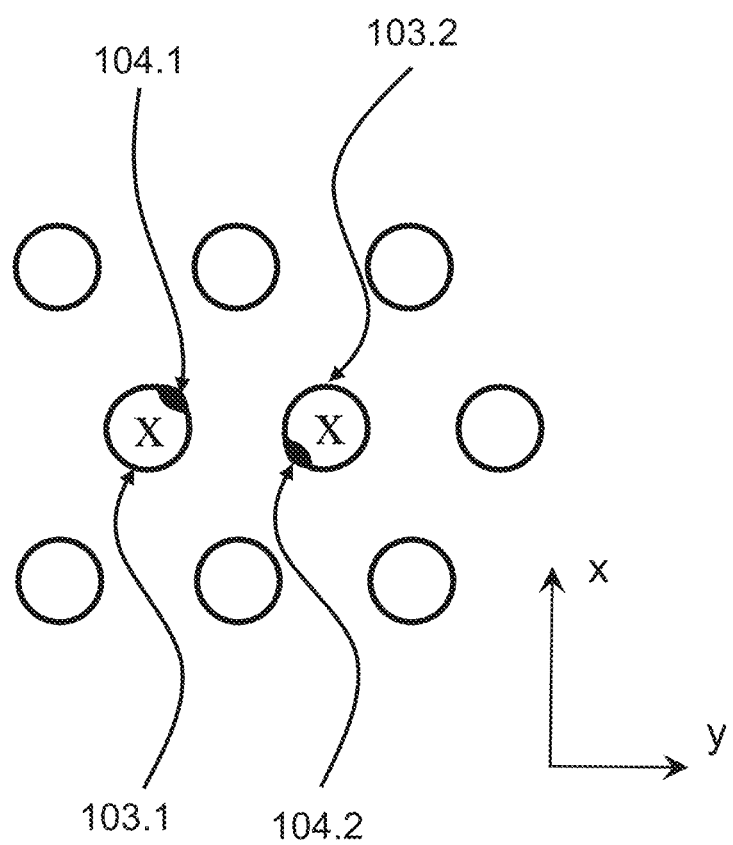

In one embodiment, the pillars are evaluated for local defects, such as a fill with a wrong material, a particle defect, contamination or any other defect, which leads to a local deviation of a circumferential cross section, in the following also called inclusion. An example is illustrated in FIG. 15A. Two pillars show such inclusions 102.1, 102.3 in their cross section 101.1, 101.2. The inclusions can extend over few intersection images of the z-series of intersection images. After contour extraction (shown in FIG. 15B), the contours 103.1 and 103.2 and the area of inclusions 104.1 and 104.2 are extracted. The defective pillars are further identified with marks "x". The area of inclusions 104.1 and 104.2 increase the roughness of the outer surface contour of the pillars and can be a source of malfunction. The inclusions 104.1 and 104.2 are for example compared to reference inclusions to decide wether a device is malfunctional or properly working. In an embodiment, the number of inclusions or marks throughout a set of pillars is evaluated and thus a rate of process errors is derived and for example monitored over a set of fabricated semiconductor samples.

Figure 16A:
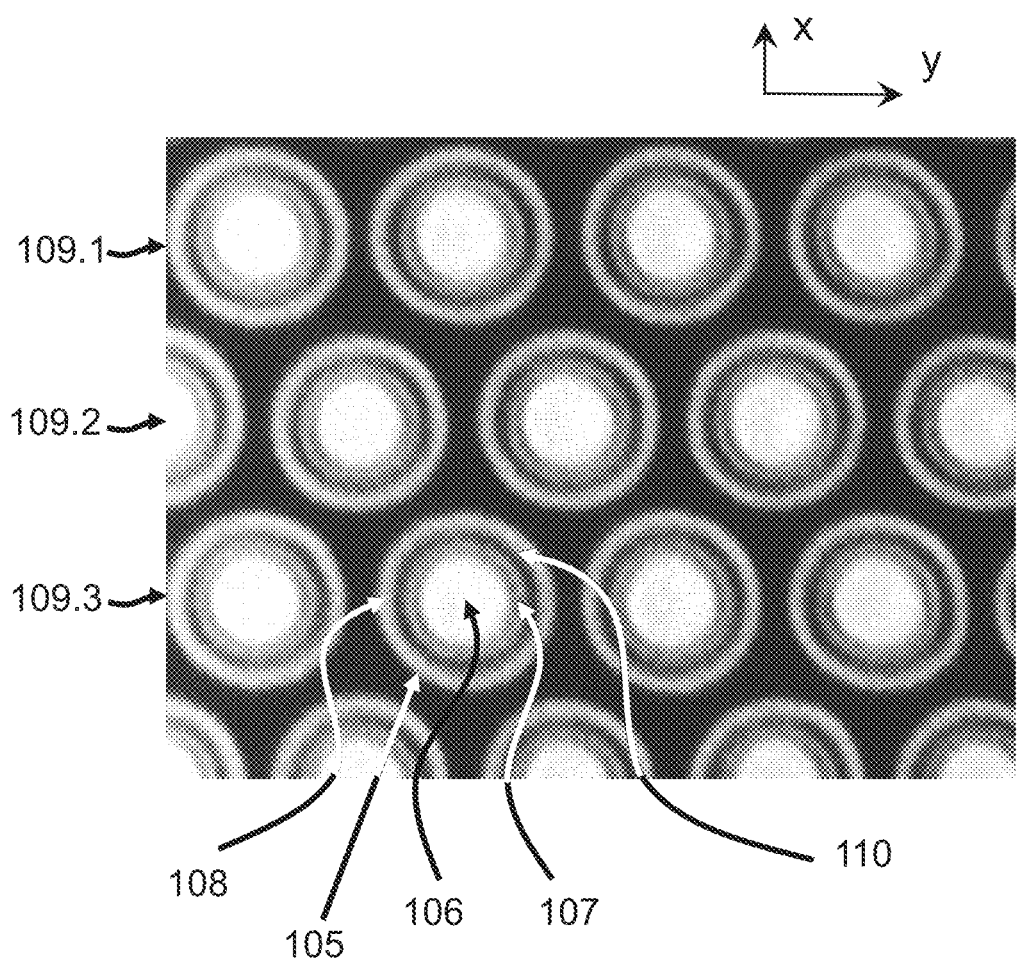
FIG. 16A shows high resolution SEM image of a set of pillars.
Figure 16B:
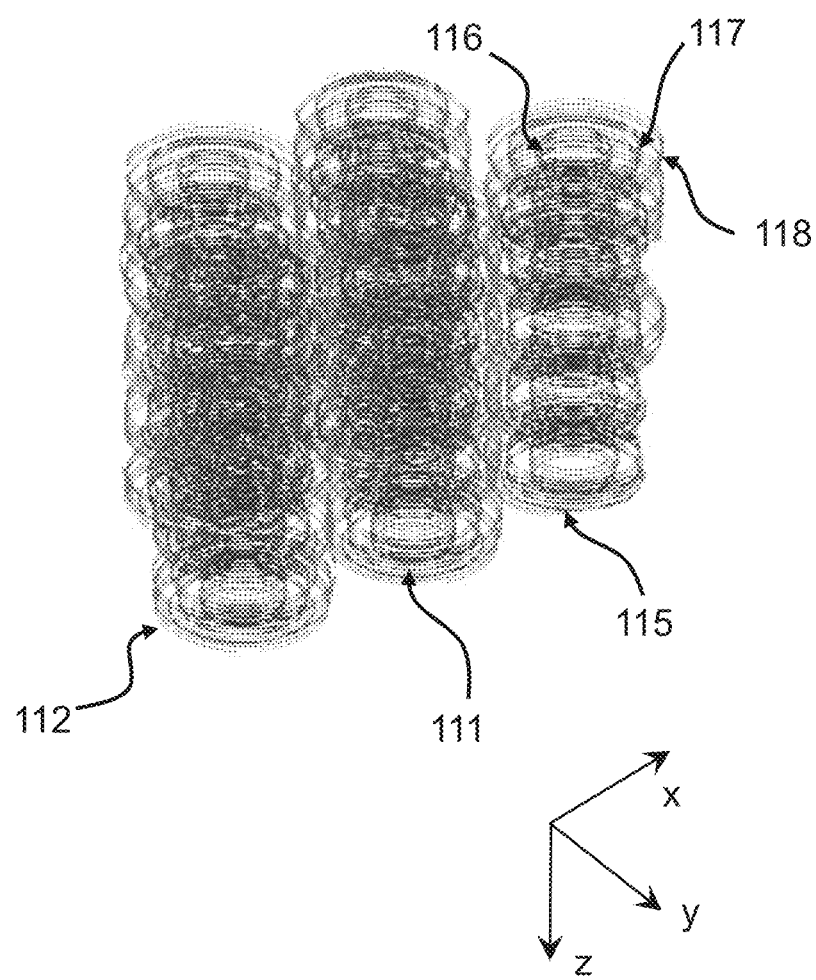
FIGS. 16B and 16C show contours of core and layers of pillars.

In an embodiment, the internal pillar structure is further analyzed. The pillars include for example an internal channel and several layers around the internal channel, made from different conducting or semiconducting materials. For example, the several layers around a core channel can include a tunnel layer, isolation layers, a charge trap layer and a block layer. In each intersection image, these layers are identified by their material contrast and can be analyzed in the same way as described above, for example the outer contour or contour, the trajectory of ring-shaped area of the layers can be derived. FIG. 16A illustrated the example of a high-resolution intersection image of an array of pillars, achieved by a SEM in high resolution mode. The figure shows a set of pillars in 3 rows 109.1, 109.2 and 109.3. At the example of one pillar 105 in row 109.3, the core 106, a first, middle layer 107 and a second, outer layer 108 are illustrated; the second, outer layer 108, and the first, middle layer 107 are separated by an isolation layer 110. FIG. 16B illustrates the extracted contours 116, 117 and 118 of the core 106 and layers 107 and 108, respectively, of the set of contours 115 of pillar 105, together with the contours of some other pillars, for example the set of contours 111, 112 of neighboring pillars.

Figure 16C:
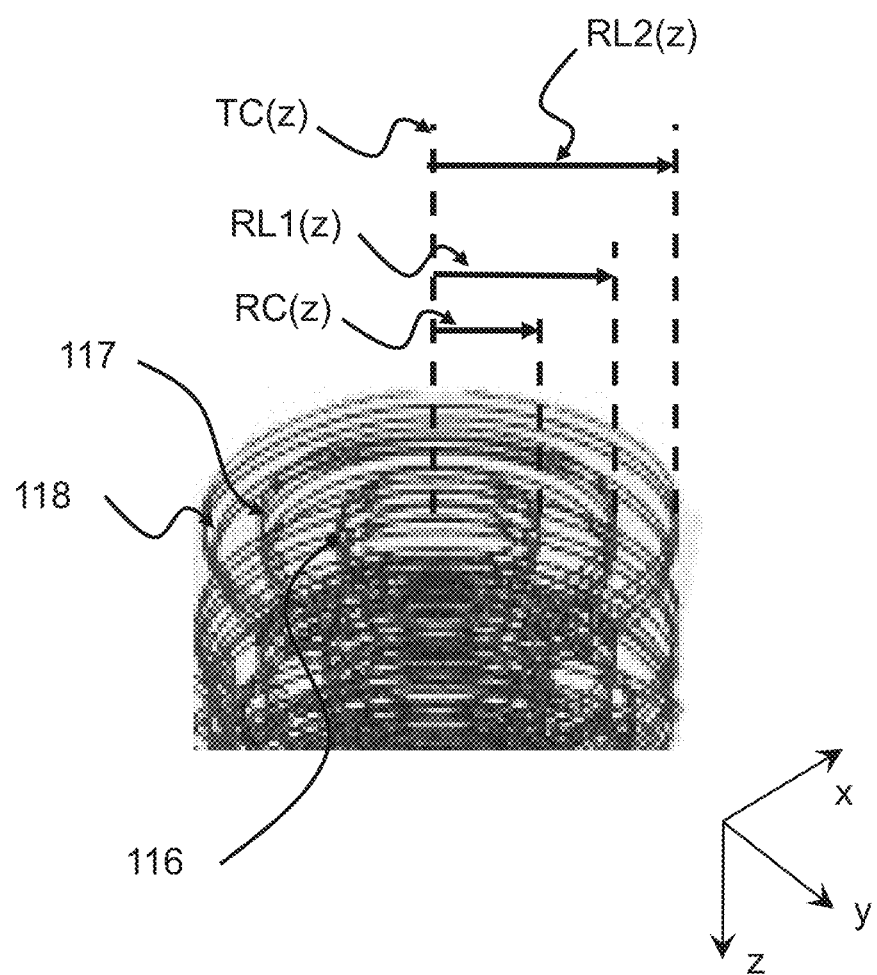

For each set of contours, the trajectories $TC(z)$, $TL1(z)$, $TL2(z)$, ... of the core and the layers, as well as the respective areas $AC(z)$, $AL1(z)$, $AL2(z)$, ... of the core and the layers of a pillar can be computed in the same manner as described above for the outer contour. In the same manner as described above, the ring thickness of layers, the internal distances between layers can be computed, and a minimum thickness or distance can be derived. FIG. 16C illustrates at an example the radius $RC(z)$, $RL1(z)$ and $RL2(z)$ relative the trajectory of the core $TC(z)$ for the contours 116, 117 and 118. All the generated parameters of a set of pillars can also be analyzed using a statistical approach, as described above. Also, local defects in layers, which can cause leaks, can be detected and counted. This allows for a detailed statistical analysis of a huge set of data characterizing the internal structure of pillars, such as local defects or inclusions of cores and layers, or distances between core and layers.

A method described above can be performed by dedicated computing systems capable of handling huge graphical data sets. A method of the disclosure is implemented as a computer program product and stored in an internal memory of the dedicated computing systems. A controller controls the operations of a microscope, such as the cross beam microscope 1, and transfer the image data generated by the microscope to a processing unit such as a graphics processor unit (GPU), the controller further controls to process the image data according to the method steps S2 to S6, the controller further controls to generate and store results in a memory devices (e.g., FLASH, random access memory (RAM), read only memory (ROM) or other suitable variants thereof). The controller is configured to operate the system according a computer program code automatically. The computer program code is embodied in a non-transitory computer readable medium and programmed to perform any number of the functions or algorithms as disclosed above. The computer program code is further configured that the controller from time to time informs a user via a graphics user interface (GUI), that a user input is desirable. The controller sets the system in a wait state, until the user input is performed. Such user input can for example be the area selection of the z-series of 2D cross section images or the confirmation of the area selection of the z-series of 2D cross section images performed by an image processor. The results such as the deviation parameters stored in the memory devices are further output in step S7 in a standard output file format or via the graphical user interface.

In inspection or review applications, a large degree of automatization is involved during the analysis of a 3D data stack, formed by a plurality of cross section image slices. In an embodiment of the disclosure, an automated workflow is provided for the 3D inspection of semiconductor wafer such as semiconductor wafers during the production of devices such as 3D memory chips (VNAND or 3D RAM). For example, 3D memory chips are composed of many pillar-like structures running parallel to each other and sometimes referred to as memory channels or "pillars". A sample containing such a 3D memory device can be studied by the cross-section imaging technique utilizing a FIB-SEM-microscope. The typical number of footprints of pillars in one slice can reach a few hundred up to 1000 or more. The typical stack of image slices can contain a few hundred images. In most applications, a large degree of automatization while reconstructing the pillars in 3D is desirable.

The typical number of footprints of pillars or other semiconductor structures in one image slice can reach a few hundred up to 1000 or more. The typical 3D data stack can contain a few hundred cross section images slices. A 3D stack of 2D cross section images can include therefore include more than 100.000 cross sections of pillars. On the other hand, each 2D image slice of 10 μm×10 μm with a resolution of below 2 nm can easily contain more than 5 gigapixel, or even more than 10 gigapixel. From this large amount of 3D volume image data, few parameters such as center position, radius and ellipticity of the about 100.000 cross sections of pillars are derived and about 500.000 numerical values are extracted. By analysis of the numerical values utilizing for example fitting algorithms and statistical methods a further reduction is achieved and significant performance indicators are provided. Examples of performance indicators are the maximum values of deviation parameter such as deviation in cross section area, the minimum distance between two pillars, a maximum tilt of a pillar within the plurality of pillars, and a maximum wiggling parameter of the plurality of pillars, and a descriptor of the variation of any of these parameters such as a statistical variance. According the embodiment of the automated workflow, up to several thousand of image cross sections of pillars or in general semiconductor structures are analyzed with high throughput. Details of the method according the embodiment will be described at the example of pillars or HAR structures in 3D memory chips, but the method is applicable in general for any types of semiconductors and wafers.

The method according the embodiment includes several steps to reduce the data amount within a 3D volume image. In a first step of automatic detection of the pillar footprints in each of the slices and automatic generation of few descriptive parameters such as center position, best fit radius, ellipticity, the large amount of about M=10 Gigapixel or more is reduced to about N2=500.000 first numerical values. For example, a list of X- and Y-coordinates of the center coordinates located at the intersection of the pillars within the image slices is extracted. The first numerical values are analyzed, and from the center positions, for example a single tilt angle for each pillar is derived, and a reduction to about N3=10.000 second numerical values is achieved. The second numerical values are further processed by statistical methods and a further reduction to for example below 10 performance indicators is derived. A first example is using classical image processing techniques, and a second example utilizes machine learning based (ML-based) approaches. The method according the embodiment involves preparatory steps for an automated inspection of semiconductor devices.

Figure 18:
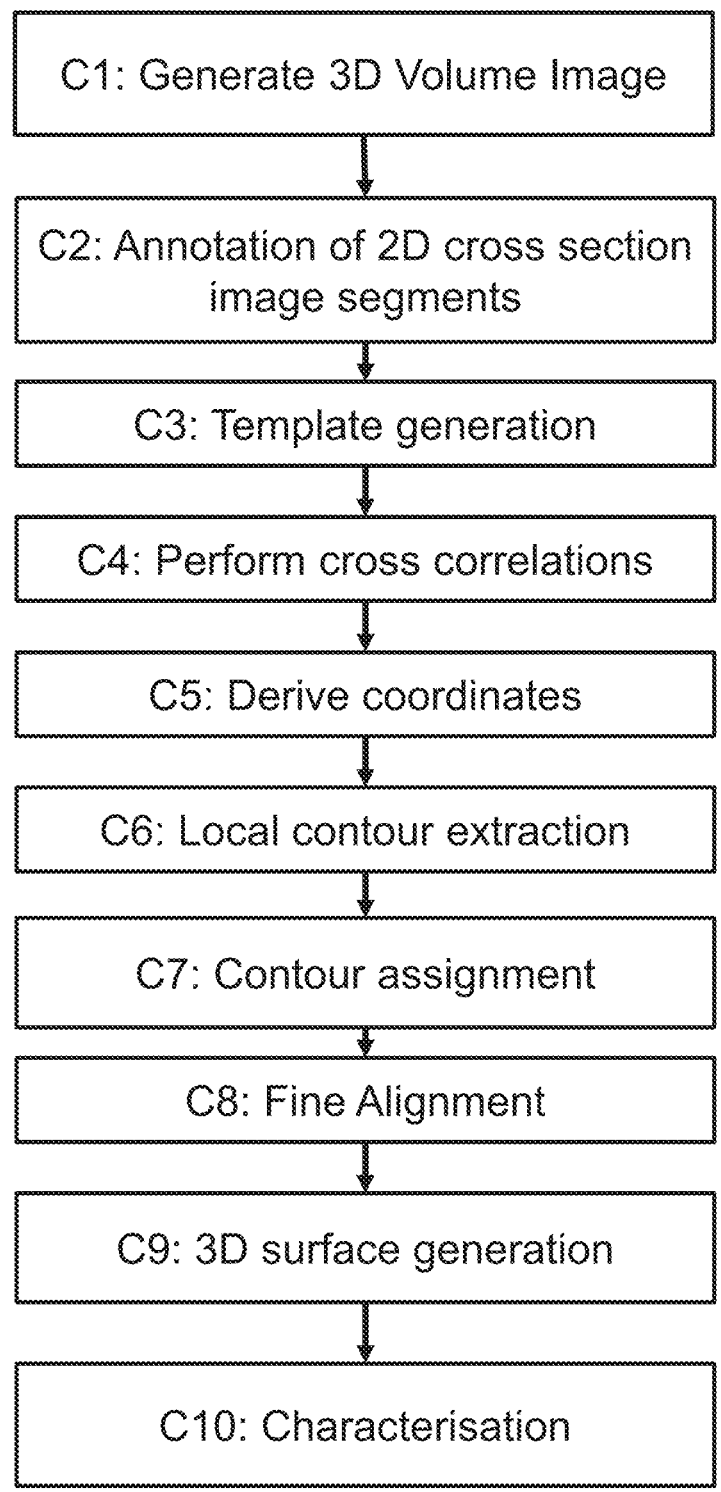
FIG. 18 shows an illustration of a method of wafer inspection including preparatory steps of an automated wafer inspection.

An example of a workflow for wafer inspection includes a reconstruction of semiconductor features which can be applied on a 3D volume image obtained with a FIB-SEM-microscope described above. An example includes the preparatory steps for automated inspection using classical image processing techniques is illustrated in FIG. 18. In the first step C1, a representative 3D volume image data is generated, for example by a method according steps S1 and S2 as described above. During the step C1 of image acquisition, the 2D cross section image slices are aligned with respect to each other, for example at alignment fiducials or other methods of image alignment. Residual alignment errors or shifts between the adjacent 2D cross sections images are small and do not exceed a predetermined alignment threshold. Before step C1, a method can include further steps of loading a wafer on a wafer table, wafer alignment and registration, forming fiducial features on the wafer surface, generating of trenches with for example a FIB or a LASER beam, and lift out of at least one sample from the wafer, for example utilizing a probe needle, to which the sample is attached. It further can include steps of positioning the sample on a holder, which can be moved and positioned in the cross over of a FIB and a charged particle imaging device of a dual beam inspection device.

In preparative step C2 of annotation of 2D cross section image segments or footprints, for example pillar footprints of interest are annotated by an operator. One or more footprints are annotated by an operator to generate a template for the cross-correlation or to train an ML-bases object detector. During the annotation step, a user annotates interactively one or more footprints in one or more slices. In an example, the annotation is assisted by a graphical user interface, configured to for example display a rectangle or circle at positions selected by an operator with a computer mouse or other input devices over a display of a 2D cross section image. In an example, the annotation is assisted by image processing algorithms for footprint detection. Such algorithms can include filter operations, edged detection or contour extraction, or morphological operations. In an example, algorithms for footprint detection utilize previously obtained templates stored in a database to perform cross-correlation operations or machine learning ("ML") based object detectors to assist an operator to select cross section image segments of interest.

In step C3 or the step of template generation, a template of cross section image features representing a semiconductor structures of interest is generated. The template is for example an idealized cross section image feature, configured for a cross-correlation. In an example, a template or idealized cross section image feature is derived from the annotated footprints of step C2. For example, the annotated footprints of step C2 are automatically aligned and averaged. In addition, image processing techniques such as noise reduction or sharpening can be applied. The template is thus an image representing a "typical" or averaged footprint of a semiconductor structure of interest, for example of a HAR structure or pillar. During the generation of a template, a representative center position of a template is determined, and the template image is adjusted with respect to the representative center position. In an example, several semiconductor structures of interest are considered and the steps C2 and C3 are performed for several semiconductor structures of interest to generate at least a first template representing a first semiconductor structure of interest and a second template representing a semiconductor structure of interest.

In step C4, a series of cross-correlations is performed. A cross-correlation of the 2D cross section image slices with the template generated in step C3 is performed. Each peak in the resulting 2D cross-correlation images (one for each matching position of the template in each 2D cross section image slice) indicate a detected footprint or cross section of semiconductor structures of interest. To improve the sensitivity and/or the robustness of the footprint detection, the cross-correlation can be performed multiple times with different templates representing a first semiconductor structures of interest. An alteration of a template representing a first semiconductor structures of interest can for example be scaled using a series of scaling factors before each cross-correlation operation. In addition, different templates can be used for different cross section image slices or for example different z-positions in the 3D-volume image.

In step C5, a list footprint coordinates or center coordinates of the channel footprints is generated, corresponding to the footprints detected in Step C4 in each 2D image cross section image slice. The lateral coordinates are derived from the lateral or x-y-positions in the 2D image cross section image slice and the z-coordinate in the 3D volume image is derived from the z-position of the 2D image cross section image slice within the 3D volume. The center positions of the 2D cross section image features of the semiconductor structures of interest detected in the 2D cross section image slices in step C4 correspond to the representative center position of a template determined in step C3.

In step C6, the 2D cross sections image features representing the footprints are segmented, i.e. the boundaries of the footprints are determined. This is done "locally" for the individual footprints, i.e. using a plurality of 2D sub-images each containing only one footprint at a center position determined in step C5. The boundaries are computed using known algorithms for contour extraction, such as edge detection, morphological operations, thresholding or equivalent methods.

In the step C7, contours or boundaries determined in step C6 are assigned to semiconductor structures of interest, for example individual HAR structures or pillars. The boundaries or contours computed in step C6 belonging to the same pillar/channel in adjacent 2D cross section image slices are determined for example according their lateral center coordinates. As a result, for each semiconductor structures of interest, a list of contours/boundaries belonging to that semiconductor structures of interest in different 2D cross section image slices is generated.

The predetermined alignment threshold of step C1 can for example be the half of the distance between two neighboring footprints. In such case, any ambiguity in the assignment of contours to a corresponding semiconductor structures of interest is avoided. In an example, however, the identification and assignment of contours belonging to the same semiconductor structures of interest is not always possible. In this example, the contours of 2D cross section image features which cannot unambiguously assigned to a semiconductor structures of interest are flagged as ambiguous.

In step C8, the footprints belonging to the same semiconductor structures of interest which have been identified in different 2D cross section image slices in step C7 are analyzed and optionally the lateral alignment of the 2D cross section image slices with respect to each other is improved. For this purpose, a mean or average shift of all footprints in one 2D cross section image slice with respect to the corresponding footprints on an adjacent 2D cross section image slice is computed for all pairs of adjacent 2D cross section image slices. The computed shifts are then applied to the corresponding center coordinates of footprints. The result of step C8 is a set of lists, each list containing the corrected center positions and contours/boundaries belonging to a semiconductor structure of interest, for example a HAR channel or pillar.

In an example, the shifts are considered in a precision alignment in the 2D cross section image slices, and step C7 of assignment is repeated for the contours which have been flagged as ambiguous in step C7.

In step C9 (3D surface generation), for each channel the contour coordinates are extracted as X-Y- and Z-coordinates as the surface points located on the surface of a semiconductor-structure of interest. The surface points can also be combined into a primitive form, e.g. a triangular mesh or 3D polygon profile for the visualization or for further analysis. The large amount of surface or contour coordinates is thereby reduced to predetermined primitives or primitive forms described by a set of parameters, which represent the semiconductor structures of interest and their predetermined typical deviations from their ideal shape. Primitives can be tilted or twisted cylinders with tilt angles and wiggling described by few parameters.

In step C10, a quantitative characterization of the semiconductor structures of interest is performed. For each semiconductor structures of interest, a set of parameters characterizing the geometry of the entire semiconductor structures of interest, for example a HAR structure or pillar is extracted or derived. Examples of such parameters are the averaged radius and ellipticity of a pillar as well as the dependences of parameters from the Z-coordinate, the inclination and curvature of a pillar's axis, proximity or closest distance between neighboring semiconductor structures of interest. The statistical properties of a large number of pillars (e.g., of all pillars in a data set) can be computed. Examples of such properties are the average radius of a set of pillars and its standard deviation, an average tilt of the pillars, an average proximity of the neighboring pillars, or the maximal and minimal values of a parameters over a plurality of pillars. Those skilled in the art may define a plurality of other statistical information representing performance indicators, for example suitable for a monitoring of a dedicated fabrication process step or suitable to determine the representative performance of the fabricated semiconductor device. The results of step C10 can also be correlated with other inspection measurements of other samples extracted from the same or a second wafer, or with the position on the wafer, from which the sample was prepared. Examples are for example a change of pillar cross section with depth, a tilt of pillars especially at the edges of wafers towards the outer circumference of a wafer, a variation of tilt angles over a wafer. Other examples are the shape of pillars, for example the average amount of a barrel-shape. The results, for example the representative primitives can also be compared to reference primitives obtained for example from CAD data of the design of the semiconductor device.

In an example of the embodiment, machine learning ("ML") based object detectors are applied. Instead of generating a template as described in step C3, in a modified step C3M the machine learning algorithm is trained with the annotated cross section image features identified during step C2. The machine learning algorithm is then applied in a modified step C4M for the automatic detection of cross section image features of the semiconductor structures of interest.

The method of inspection can also further include a modified step C6M utilizing local segmentation based on machine learning (ML). After the coordinates of the footprints are determined in a previous step, the boundaries or contours of the footprints are determined, and the footprints are segmented and separated from the background. The boundaries or contours can also be computed by using an ML-bases segmentation algorithm.

It is clear from the description above, that the steps C2 and C3 are preparatory steps and performed for preparing a routine inspection task. In a routine inspection task, steps C2 and C3 are omitted, and instead, a preselected set of templates, determined in a preparatory workflow and for example stored in a database, is utilized for steps C4 and further. It is also understood that during a routine inspection, the steps can overlap. For example, step C4 can overlap with step C1, and the identification of footprints by correlation with a template can start for example with the first 2D cross section image obtained during step C1. It is also possible that some process steps can be performed in changed order. For example, the step of C9 of 3D surface generation can for example be performed at a representative set of semiconductor structures of interest before step C8 of fine alignment, and the execution of the fine alignment according step C8 can be subject to a result of an analysis of the representative 3D surfaces. It is also possible that the step C8 of fine alignment is performed directly after step C5.

A method including any of steps C4 to C10 or including the modified steps C4M or C6M benefits from a faster computation time. In the method, in a first step, the amount of volume data of the 3D volume image is reduced by a factor of more than 10000 to the first numerical values. The first numerical values include lists of center positions and contour coordinates of semiconductor structures of interest, as obtained for example in step C5 to C7. The first numerical values are further reduced to the parameters of the representative primitive forms during step C9. Thereby, the number of first numerical values is further reduced to second numerical values by a factor of about 50. The method further benefits from statistical averaging, including a statistical averaging of step C9 during the generation of representative primitives.

The above examples are illustrated at the examples of HAR channels or pillars as semiconductor structures of interest. Other semiconductor structures of interest can be Vias in the logic probes. Vias are the vertical contacting structures between the adjacent horizontal layers of logic chips containing various IC-elements. Such vias can be handled in the same way as the HAR channels or pillars in the 3D memory probes. Other examples are metal lines or connections in the logic chips. A series of such metal lines which are known (e.g., from the available design information) to be parallel to each other can be handled in the same way as memory channels in the 3D-memory chips.

A method according to the disclosure can be applied in fabrication process characterization, fabrication process optimization or/and fabrication process monitoring for the process development or fabrication of semiconductor devices.

The above described embodiments can be fully or partly combined with one another. Also, modifications or the method, the derived parameters or statistical values known by those skilled in the are possible within the scope of the disclosure. While the method according FIG. 5 is explained in sequence S1 to S5, the sequence of at least two method steps, such as the sequence of method step S2 and S3, can be exchanged.

LIST OF REFERENCE SIGNS

| No. | Item |
|---|---|
| 1 | cross beam microscope |
| 2 | cross section surface |
| 3 | cross section surface |
| 4 | cross section surface |
| 5 | Focused ion beam (FIB) |
| 6 | angle between CPB and FIB |
| 7 | charged particle beam (CPB) |
| 8 | scanning imaging lines of raster scan |
| 9 | ion beam |
| 10 | block shaped sample |

-continued

| No. | Item |
|---|---|
| 11 | cross section surface |
| 18 | 2D cross section image |
| 20 | stack of 2D cross section images at distance dz, respectively |
| 50 | integrated semiconductor |
| 51 | Silicon substrate |
| 52 | top surface |
| 54.1, 54.2, . . . 54.22, 54.1 . . . 54.k . . . 54.z | planar layers of semiconductor device |
| 55 | via |
| 56 | metal structure |
| 57 | gate |
| 58 | doped structure |
| 59 | contact |
| 60 | pillars or HAR structures |
| 62 | pillar segments |
| 63 | thin gaps |
| 64 | trajectory of the pillar |
| 66 | outer circumference of the HAR structure |
| 68.1, 68.2 | groups of pillars |
| 69 | separating structure |
| 70 | inclination angle Θ |
| 72.1 | pillar segments |
| 72.2 | pillar segment with larger diameter |
| 72.3 | pillar segment with smaller diameter |
| 74.1 | inclined trajectory |
| 74.2 | non-linear trajectory |
| 75 | intersection plane |
| 76.1 | circumference of elliptical shape |
| 76.2 | circumference of general shape |
| 78.1, 78.2 | cross sections of pillars |
| 79 | cross section of group of pillars |
| 80 | an example of one identified pillar |
| 82 | circumference of the pillar 80 |
| 90.1, 90.2 | pillar described by stack of circumferences |
| 92 | stack of circumferences |
| 94 | minimum distance vector between two circumferences |
| 96 | center of one pillar |
| 97 | displacement vector, or T(z) of one pillar |
| 101.1, 101.2 | cross sections |
| 102.1, 102.2 | inclusions or defects |
| 103.1, 103.2 | circumference of cross sections 101.1, 101.2 |
| 104.1, 104.2 | the area of inclusions 102.1, 102.2 |
| 105 | one pillar |
| 106 | core of a pillar |
| 107 | first, middle layer |
| 108 | second, outer layer |
| 109.1, 109.2, 109.3 | rows of pillars |
| 110 | Isolation layer |
| 111 | set of contours of a pillar |
| 112 | set of contours of a pillar |
| 115 | set of contours of pillar 105 |
| 116 | extracted contour of core 106 |
| 117 | extracted contour of first, middle layer 107 |
| 118 | extracted contour of second, outer layer 108 |

What is claimed is:

1. A method, comprising:
using a charged particle microscope comprising at least one charged particle optical column to obtain a 3D tomographic image of a semiconductor wafer;
selecting a subset of 2D cross section image segments from the 3D tomographic image, each 2D cross section image section comprising cross section images of a set of HAR structures in the semiconductor wafer;
identifying a contour of each HAR structure within the set of HAR structures in the subset of 2D cross section images;
extracting deviation parameters from the contours of the HAR structures within the set of HAR structures; and
analyzing the deviation parameters,
wherein:
the deviation parameters comprise at least one member selected from the group consisting of a displacement from an ideal position, a deviation in radius or diameter, a deviation from a cross section area, and a deviation from a shape of a cross section;
the HAR structure comprises an internal channel, a first layer around the internal channel, and a second layer around the first layer so that the first layer is between the internal channel and the second layer;
the first layer comprises a first material;
the second layer comprises a second material different from the first material; and
the method comprises identifying the first layer and the second layer based on differences between the first and second materials.

2. The method of claim 1, wherein step of analyzing the deviation parameters includes performing statistical analysis of at least one deviation parameter of at least one HAR structure of the set of HAR structures.

3. The method of claim 1, further comprising obtaining the 3D tomographic image.

4. The method of claim 1, wherein identifying the contour of each HAR structures comprises at least one member selected from the group consisting of image processing, edge detection, and pattern recognition.

5. The method of claim 1, wherein analyzing the deviation parameters comprises a computation of minimum or maximum values of at least one deviation parameter of at least one HAR structure of the set of HAR structures.

6. The method of claim 1, wherein extracting the deviation parameters further comprises computing a distance between two adjacent HAR structures and a minimum distance between the two adjacent HAR structures.

7. The method of claim 1, further comprising detecting and localizing at least one member selected from the group consisting of a local defect in at least one HAR structure of the set of HAR structures, and an inclusion in at least one HAR structure of the set of HAR structures.

8. The method of claim 1, wherein:
the charged particle microscope comprises a high-resolution scanning electron microscope; and
the method further comprises using the image to identify and localize an internal structure of a HAR structure comprising a core and a layer around the core.

9. The method of claim 8, further comprising:
extracting a deviation parameter from the contours of the internal structure of the at least one HAR structure; and
analyzing the deviation parameter.

10. The method of claim 1, further comprising at least one member selected from the group consisting of characterizing a step of a fabrication process, optimizing a fabrication process optimization, and monitoring a fabrication process.

11. One or more non-transitory machine-readable hardware storage devices comprising instructions that are executable by one or more processing devices to perform operations comprising the method of claim 1.

12. A system, comprising:
one or more processing devices; and
one or more non-transitory machine-readable hardware storage devices comprising instructions that are executable by the one or more processing devices to perform operations comprising the method of claim 1.

13. The method of claim 1, wherein the deviation parameter comprises a displacement from an ideal position, and the displacement from the ideal position comprises at least one member selected from the group consisting of a tilt of a HAR structure and a lateral displacement of segments of a HAR structure.

14. The method of claim 1, wherein:
the first material comprises a conducting material or a semiconducting material; and
the second material comprises a conducting material or a semiconducting material.

15. The method of claim 14, wherein the deviation parameter comprises a displacement from an ideal position, and the displacement from the ideal position comprises at least one member selected from the group consisting of a tilt of a HAR structure and a lateral displacement of segments of a HAR structure.

16. The method of claim 1, further comprising a third layer, wherein the third layer is around the first layer so that the third layer is between the first layer and the second layer.

17. The method of claim 16, wherein:
the first material comprises a conducting material or a semiconducting material;
the second material comprises a conducting material or a semiconducting material; and
the third layer comprises an isolation layer.

18. The method of claim 17, wherein the deviation parameter comprises a displacement from an ideal position, and the displacement from the ideal position comprises at least one member selected from the group consisting of a tilt of a HAR structure and a lateral displacement of segments of a HAR structure.

19. The method of claim 16, wherein the deviation parameter comprises a displacement from an ideal position, and the displacement from the ideal position comprises at least one member selected from the group consisting of a tilt of a HAR structure and a lateral displacement of segments of a HAR structure.

\* \* \* \* \*

UNITED STATES PATENT AND TRADEMARK OFFICE
CERTIFICATE OF CORRECTION

PATENT NO. : 12,288,705 B2  
APPLICATION NO. : 17/707151  
DATED : April 29, 2025  
INVENTOR(S) : Amir Avishai et al.

Page 1 of 1

It is certified that error appears in the above-identified patent and that said Letters Patent is hereby corrected as shown below:

In the Specification

Column 4, Line 51, after "derived" insert -- . --.

Column 8, Line 35, delete "4a." and insert -- 4A. --.

Column 13, Line 61, delete "(as" and insert -- as --.

Column 13, Line 61, after "well as" delete "m".

Column 13, Line 61, after "deviation" delete "on".

Column 14, Line 48, delete "wether" and insert -- whether --.

Signed and Sealed this  
Seventeenth Day of June, 2025

Coke Morgan Stewart  
*Acting Director of the United States Patent and Trademark Office*